(12) United States Patent
Yamazoe

(10) Patent No.: US 7,761,840 B2
(45) Date of Patent: Jul. 20, 2010

(54) MASK DATA GENERATION INCLUDING A MAIN PATTERN AND AN AUXILIARY PATTERN

(75) Inventor: Kenji Yamazoe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 369 days.

(21) Appl. No.: 11/855,698

(22) Filed: Sep. 14, 2007

(65) Prior Publication Data

US 2008/0070131 A1 Mar. 20, 2008

(30) Foreign Application Priority Data

Sep. 20, 2006 (JP) .............................. 2006-254980

(51) Int. Cl.
*G06F 17/50* (2006.01)
(52) U.S. Cl. ........................................................ 716/21
(58) Field of Classification Search .............. 716/19–21; 430/5; 382/144–145
See application file for complete search history.

(56) References Cited

U.S. PATENT DOCUMENTS

| | | | | |
|---|---|---|---|---|
| 5,357,311 | A | 10/1994 | Shiraishi | 355/53 |
| 7,100,145 | B2 | 8/2006 | Shi et al. | 716/19 |
| 7,107,573 | B2 | 9/2006 | Yamazoe et al. | 716/21 |
| 7,231,629 | B2 | 6/2007 | Laidig | 716/21 |
| 7,506,299 | B2 * | 3/2009 | Socha et al. | 716/19 |
| 7,596,776 | B2 * | 9/2009 | Tanaka et al. | 716/21 |
| 2004/0229133 | A1 | 11/2004 | Socha et al. | 430/5 |
| 2005/0142470 | A1 | 6/2005 | Socha et al. | 430/30 |
| 2005/0149900 | A1 | 7/2005 | Laidig | 716/19 |
| 2007/0168898 | A1 | 7/2007 | Gupta et al. | 716/9 |
| 2008/0070131 | A1 | 3/2008 | Yamazoe | 430/5 |

FOREIGN PATENT DOCUMENTS

| | | |
|---|---|---|
| EP | 1 237 046 A2 | 9/2002 |
| EP | 1 239 331 A2 | 9/2002 |
| EP | 1439420 A1 | 7/2004 |
| EP | 1544680 A2 | 6/2005 |
| JP | 2004-221594 A | 8/2004 |
| JP | 2005-183981 A | 7/2005 |
| WO | WO 01/61412 A1 | 8/2001 |

OTHER PUBLICATIONS

Robert Socha, et al. "Simultaneous Source Mask Optimization (SMO)," Proceedings of SPIE, vol. 5853 (2005), pp. 180-193.
European Search Report dated Feb. 5, 2008, mailed in a Communication dated Feb. 11, 2008, in copending European patent application No. 07 01 8089.

* cited by examiner

*Primary Examiner*—Stacy A Whitmore
(74) *Attorney, Agent, or Firm*—Fitzpatrick, Cella, Harper & Scinto

(57) ABSTRACT

A computer-readable recording medium recording a mask data generation program which causes a computer to generate data of a mask illuminated by illumination light and used to form a latent image on a photoresist via a projection optical system. The program causes the computer to execute a map generation step of Fourier-transforming a function indicating an effective light source to generate a coherence map expressing a coherence distribution on an object plane of the projection optical system, on which the mask is arranged, an arrangement step of arranging a main pattern at an origin of the coherence map and arranging an auxiliary pattern in a region where a coherence with respect to the origin is not less than a set value, and a data generation step of generating mask data including the main pattern and the auxiliary pattern, which are arranged in the arrangement step.

9 Claims, 30 Drawing Sheets

F I G. 25
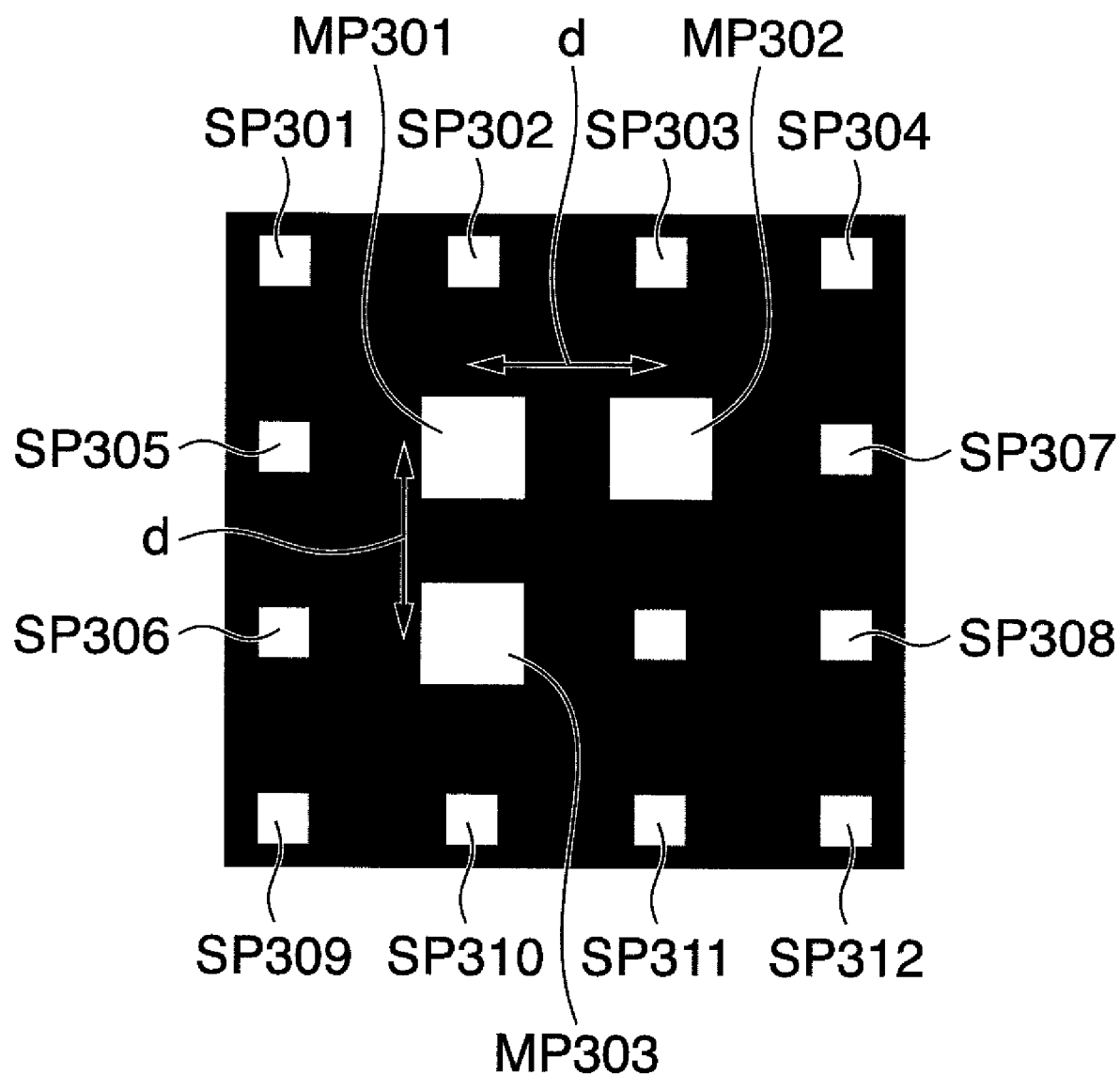

F I G. 30
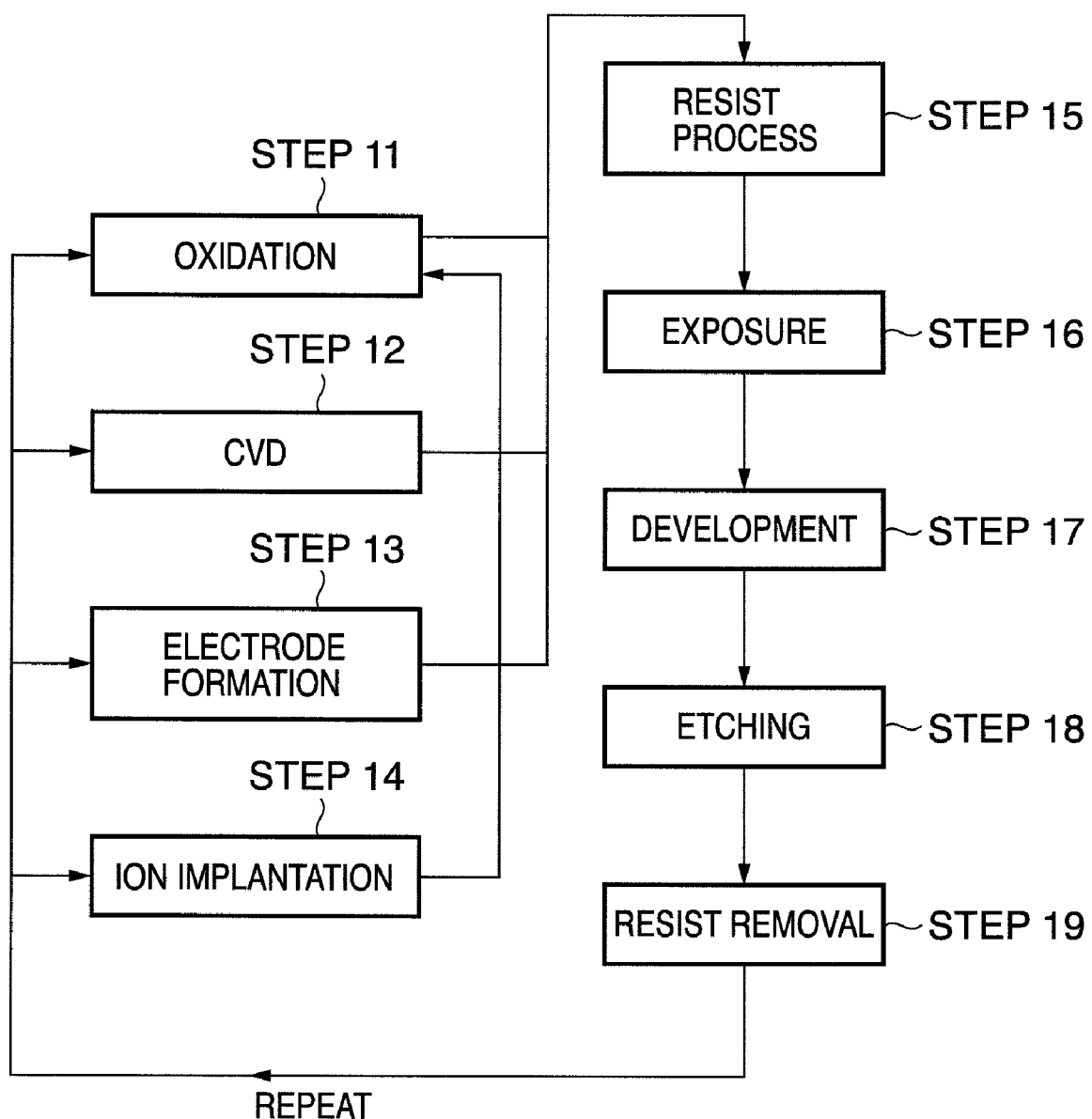

MASK DATA GENERATION INCLUDING A MAIN PATTERN AND AN AUXILIARY PATTERN

This application claims the benefit of Japanese Patent Application No. 2006-254980, filed Sep. 20, 2006, which is hereby incorporated by reference herein in its entirety.

BACKGROUND OF THE INVENTION

1. Field of the Invention

The present invention relates to computer-readable recording medium for recording a mask data generation program, a mask data generation method, a mask fabrication method, an exposure method, and a device manufacturing method.

2. Description of the Related Art

There has conventionally been used a projection exposure apparatus, which causes a projection optical system to transfer a circuit pattern drawn on a mask (reticle) onto a substrate (e.g., a wafer). Under the circumstances, a demand for a high-resolution exposure apparatus is increasing. Known high-resolution exposure methods increase the numerical aperture (NA) of a projection optical system, shorten the exposure wavelength ($\lambda$), or decrease the k1 factor.

Circuit patterns are roughly classified into interconnection patterns (line patterns) and contact hole patterns. Generally speaking, it is more difficult to expose fine contact hole patterns than fine line patterns.

Various improvements in exposure techniques are being attempted, to form fine contact hole patterns by exposure. A representative technique inserts an auxiliary pattern that is not resolvable in a mask on which a contact hole pattern to be transferred is drawn. This is one approach to decreasing the k1 factor.

Japanese Patent Laid-Open Nos. 2004-221594 and 2005-138981 have described techniques of deriving, by numerical calculation, how to insert an auxiliary pattern. According to these techniques, an approximate distribution of imaging plane amplitude is obtained by numerical calculation to derive an interference map. That is, the interference map expresses an approximate distribution of imaging plane amplitude.

More specifically, a transmission cross coefficient (to be referred to as a TCC hereafter) is derived. An aerial image undergoes decomposition (singular value decomposition; SVD) into N images (called eigenfunctions, N: a natural number) on the basis of the TCC result. This method is called a sum of coherent system decomposition (to be referred to as SOCS hereafter).

The N eigenfunctions decomposed by SOCS each have a positive or a negative value. An eigenvalue ($i^{th}$ eigenvalue) corresponding to the $i^{th}$ eigenfunction is multiplied by the square of the absolute value of the $i^{th}$ eigenfunction to obtain N functions. The N functions are added to obtain an aerial image.

Assuming that a largest eigenvalue is the first eigenvalue and its corresponding eigenfunction is the first eigenfunction, the first eigenfunction most contributes to forming an aerial image. In view of this, the aerial image is approximated by the first eigenfunction. This approximation allows the derivation of an imaging plane amplitude distribution. That is, an interference map can be calculated.

An auxiliary pattern is inserted in a portion having a positive value in the interference map, such that exposure light transmitted through the contact hole pattern is in phase with that transmitted through the auxiliary pattern. An auxiliary pattern is inserted in a portion having a negative value in the interference map, such that the phase difference between exposure light transmitted through the contact hole pattern and that transmitted through the auxiliary pattern is 180°.

Unfortunately, the techniques described in Japanese Patent Laid-Open Nos. 2004-221594 and 2005-183981 require the calculation of a TCC and eigenfunction to derive an interference map. This often complicates the whole numerical calculation, to result in a long mask data generation time.

SUMMARY OF THE INVENTION

It is an object of the present invention to provide a mask data generation program and mask data generation method, which can shorten the mask data generation time.

According to a first aspect, the present invention provides a computer-readable recording medium recording a mask data generation program, which causes a computer to generate data of a mask illuminated by illumination light and used to form a latent image on a photoresist via a projection optical system, the program causing the computer to execute a map generation step of Fourier-transforming a function indicating an effective light source to generate a coherence map expressing a coherence distribution on an object plane of the projection optical system, on which the mask is arranged, an arrangement step of arranging a main pattern at an origin of the coherence map and arranging an auxiliary pattern in a region where a coherence with respect to the origin is not less than a set value, and a data generation step of generating mask data, including the main pattern and the auxiliary pattern, which are arranged in the arrangement step.

According to a second aspect, the present invention provides a mask data generation method of generating data of a mask illuminated by illumination light and used to form a latent image on a photoresist via a projection optical system, the method comprising a map generation step of Fourier-transforming a function indicating an effective light source to generate a coherence map expressing a coherence distribution on an object plane of the projection optical system, on which the mask is arranged, an arrangement step of arranging a main pattern at an origin of the coherence map and arranging an auxiliary pattern in a region where a coherence with respect to the origin is not less than a set value, and a data generation step of generating mask data, including the main pattern and the auxiliary pattern, which are arranged in the arrangement step.

According to the present invention, it is possible to shorten the mask data generation time.

Further features of the present invention will become apparent from the following description of exemplary embodiments, with reference to the attached drawings.

BRIEF DESCRIPTION OF THE DRAWINGS

FIG. 25 is a view showing mask data according to the sixth working example of the present invention;

FIG. 30 is a flowchart illustrating the device manufacturing method using the exposure apparatus.

DESCRIPTION OF THE EMBODIMENTS

The present invention is especially applicable in generating mask data used for micromechanics or various devices, e.g., a semiconductor chip, such as an IC or LSI, a display element, such as a liquid crystal panel, a detection element, such as a magnetic head, and an image sensing element, such as a CCD. The micromechanics here means a sophisticated micron-order machinery system or a technique of building this system, which are attained by applying a semiconductor integrated circuit manufacturing technology to the manufacture of a microstructure. The present invention is suitable for so-called immersion exposure for bringing the final surface of a projection optical system and the surface of a wafer into contact with a liquid, and forming a latent image on a photoresist via the projection optical system and liquid.

The present invention discloses a concept which can be mathematically modeled. It is, therefore, possible to implement this concept as a software function of a computer system. The software function of the computer system includes programming executable software codes and enables an auxiliary pattern to be inserted in a mask pattern. A general computer can execute the software codes. During operation of the software code, the software codes, or their associated data, are stored in a general computer platform. In some cases, the software is stored in another site or loaded by another appropriate general computer system. Accordingly, at least one machine-readable recording medium can hold the software codes as one or a plurality of modules. The invention to be described hereafter written in the code form, as described above, can function as one or a plurality of software products. A processor of the computer system executes the software codes. The computer platform can execute methods to be described in this specification and shown in the embodiments, a catalog, or a software download function.

Figure 1:
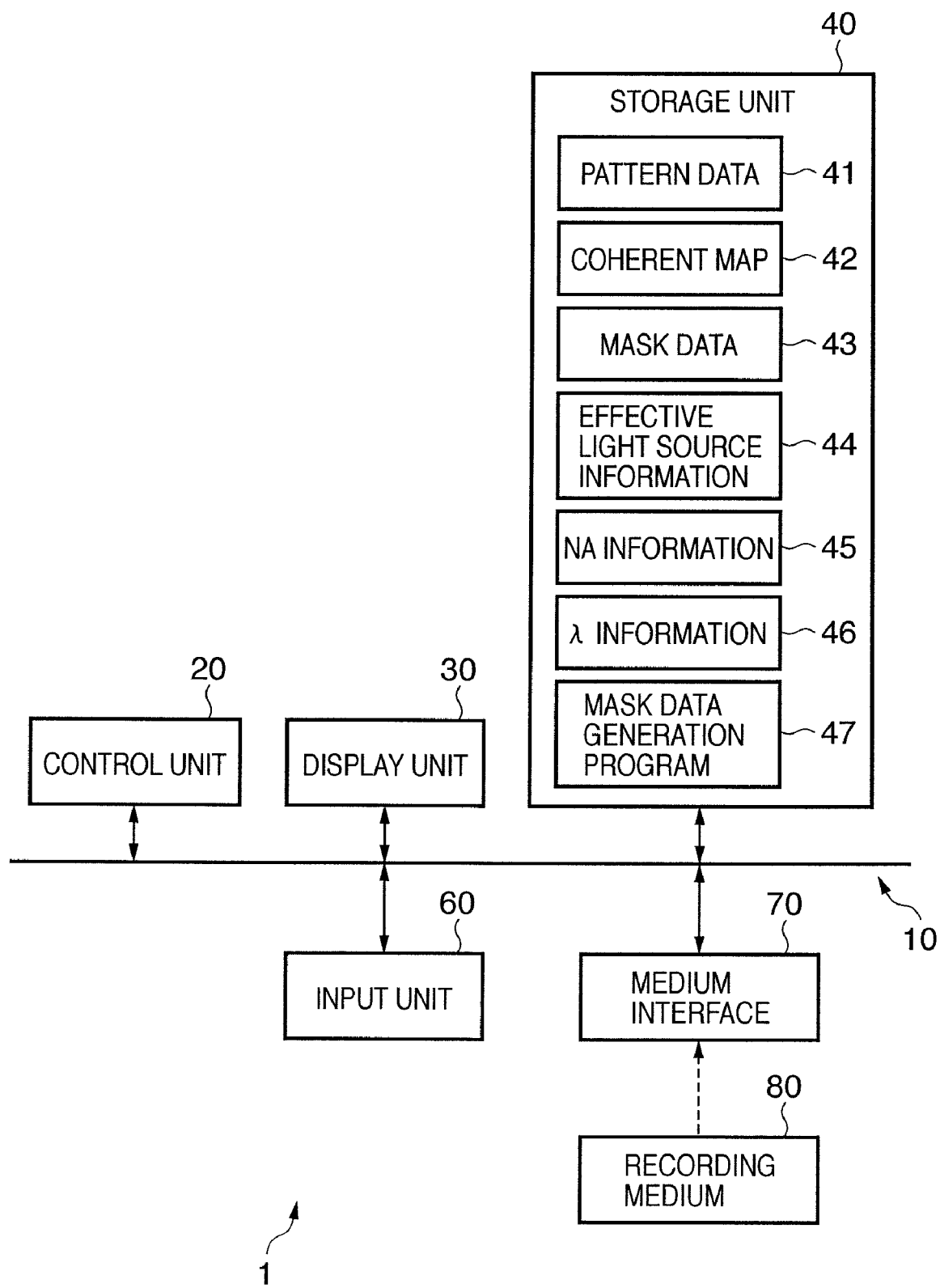
FIG. 1 is a block diagram showing the configuration of a computer according to an embodiment of the present invention.

The configuration of a computer for executing a mask data generation program according to an embodiment of the present invention will be explained next, with reference to FIG. 1.

A computer 1 comprises a bus 10, a control unit 20, a display unit 30, a storage unit, an input unit 60, and a medium interface 70.

The control unit 20, display unit 30, storage unit 40, input unit 60, and medium interface 70 connect to each other via the bus 10. The medium interface 70 is connectable to a recording medium 80.

The storage unit 40 stores pattern data 41, coherence map 42, mask data 43, effective light source information 44, NA information 45, λ information 46, and mask data generation program 47, which generates mask data. The pattern data 41 is of a pattern (to be referred to as a layout pattern hereafter) having the layout design of, e.g., an integrated circuit. As will be described later, the coherence map 42 expresses a coherence distribution on a plane (the object plate of a projection optical system), on which a mask is arranged. The mask data 43 is used to draw a pattern of, e.g., Cr on the mask. The effective light source information 44 is associated with a light intensity distribution formed on a pupil plane 142 (see FIG. 28) of the projection optical system in an exposure apparatus 100 (see FIG. 28; to be described later). The NA information 45 is associated with an image side numerical aperture NA of the projection optical system in the exposure apparatus 100. The wavelength λ of information 46 is associated with the wavelength λ of exposure light. The mask data generation program 47 is used to generate mask data.

The control unit 20 is, e.g., a CPU, GPU, DSP, or a microcomputer, and further includes a cache memory for temporal storage. Examples of the display unit 30 are a CFT display and a liquid crystal display. Examples of the storage unit 40 are a memory and a hard disk. Examples of the input unit 60 are a keyboard and a mouse. Examples of the medium interface 70 are a floppy (Japanese registered trademark) disk drive, a CD-ROM drive, and a USB interface. Examples of the recording medium 80 are a floppy disk, a CD-ROM, and a USB memory.

The arrangement of the coherence map 42 according to the embodiment of the present invention will be explained.

Let λ be the wavelength of exposure light of the exposure apparatus 100 (see FIG. 28), NA be the image side numerical aperture of the projection optical system, and σ be the ratio between the object side numerical aperture of the projection optical system and a numerical aperture formed by the light beam guided to the mask surface by the illumination optical system.

Since the exposure apparatus can take various NA and λ values, it is convenient to normalize the pattern size by (λ/NA). For example, if λ is 248 nm and NA is 0.73, 100 nm is normalized into 0.29 in the above-described manner. This normalization will be called "conversion by a k1 value" throughout this specification. The size here means not the area, but the length of one side of a pattern.

A pattern (to be referred to as a mask pattern hereafter) of, e.g., Cr drawn on the mask, has a size different from that of a pattern (to be referred to as a wafer pattern hereafter) formed on the wafer surface by the magnification of the projection optical system. For the sake of simplicity, a dimension (coordinate position) on the mask surface is indicated by a magnitude corresponding to the size of the wafer pattern obtained by multiplying the size of the mask pattern by the magnification of the projection optical system, such that the sizes of the mask pattern and wafer pattern have a one-to-one correspondence. The mask surface here means the object plane of the projection optical system, on which the mask is arranged.

A mask pattern and wafer pattern in the semiconductor exposure apparatus have a partial coherent imaging relationship. The partial coherent imaging requires effective light source information 44 to determine coherence on the mask surface. The coherence here means the degree of interference corresponding to distance on the mask surface. For example, when two elements of the mask pattern are arranged at a distance at which the coherence is zero, light beams diffracted by the two elements never interfere with each other.

The coherence can be obtained by Fourier-transforming an effective light source in accordance with the van Cittert-Zernike theorem. More strictly speaking, the coherence is given as the absolute value of the Fourier transform of the effective light source. In the following description, the absolute value of the Fourier transform of the effective light source will be called a coherence map, for convenience.

The coherence map 42 expresses a coherence distribution on the mask surface, and always takes positive values. In contrast, the interference map explained in "BACKGROUND OF THE INVENTION" expresses an approximate distribution of imaging plane amplitude, and takes positive or negative values. For this reason, the coherence map 42 and interference map deal with completely different physical quantities and have completely different properties.

Figure 3:
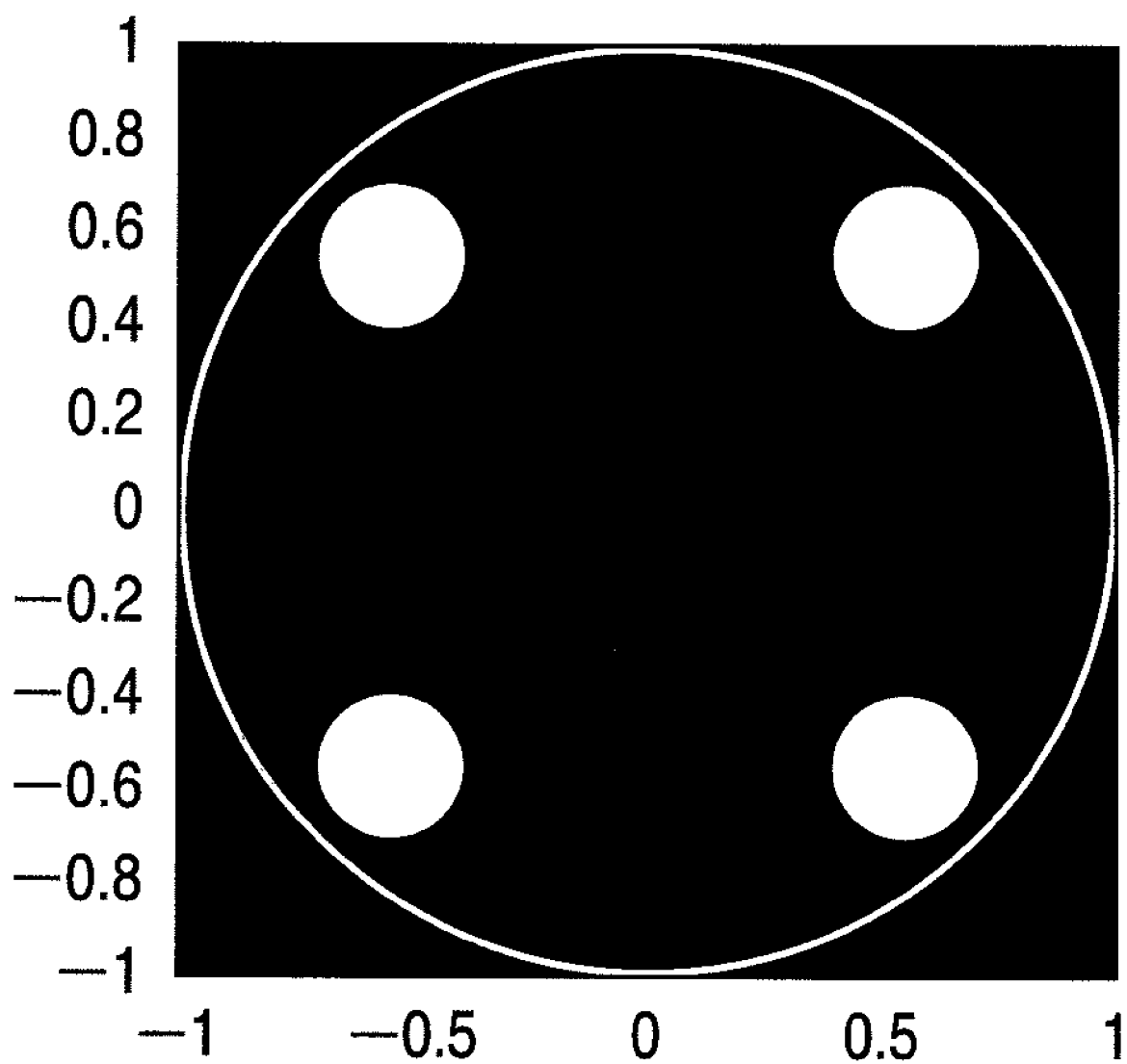
FIG. 3 is a graph showing an effective light source according to the embodiment of the present invention.
Figure 4:
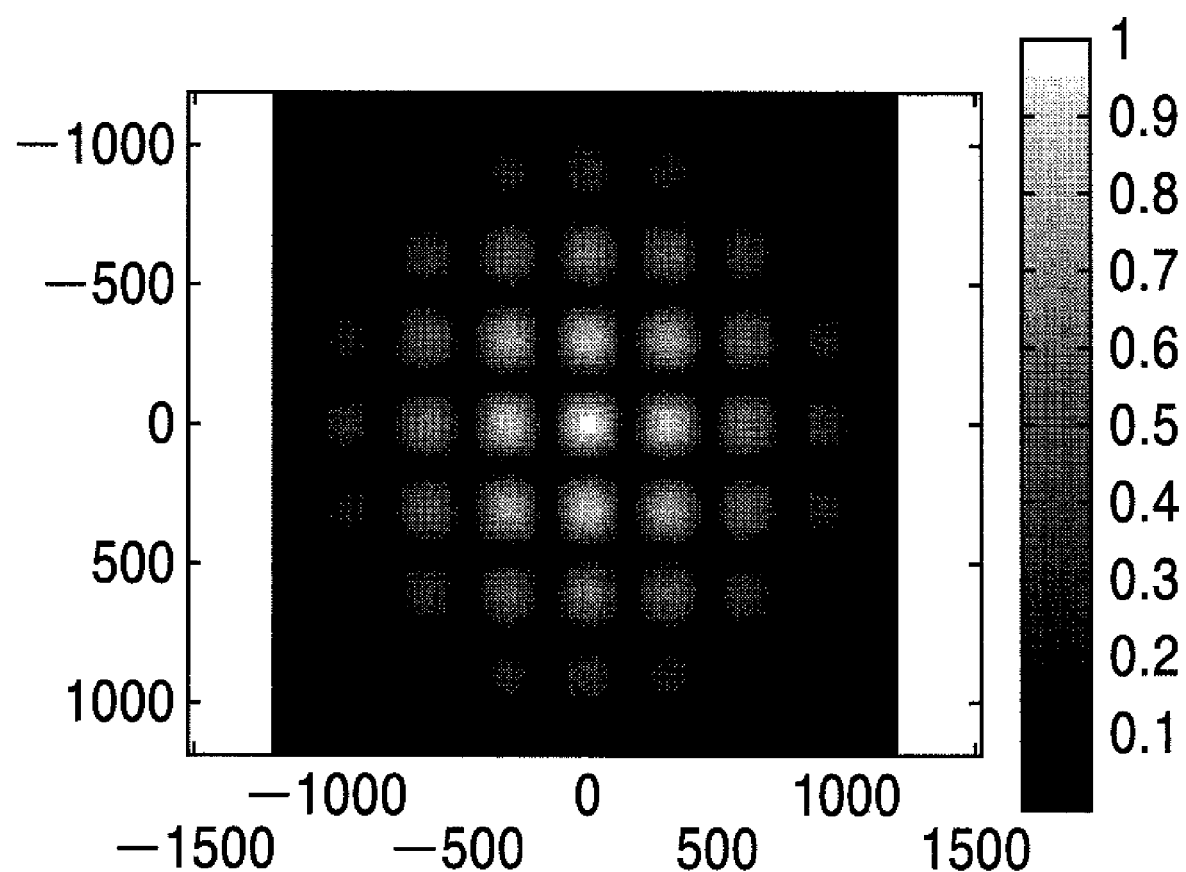
FIG. 4 is a graph showing a coherence map according to the embodiment of the present invention.

FIG. 3 exemplifies the effective light source (effective light source information 44). FIG. 4 exemplifies the coherence map 42.

FIG. 3 shows a light intensity distribution formed on the pupil plane of the projection optical system by the illumination optical system without a mask. Referring to FIG. 3, the light intensity distribution is normalized, assuming that the radius of the pupil of the projection optical system is one. White portions indicate light irradiated regions, and a circle, which has a radius of one and is drawn by a white line, indicates σ=1. The NA (the image side numerical aperture of the projection optical system) of the exposure apparatus 0.73, and the wavelength is 248 nm.

FIG. 4 shows the coherence map 42 obtained by Fourier-transforming a function indicating the effective light source shown in FIG. 3. Referring to FIG. 4, the abscissa indicates the x coordinate of the mask surface (unit: nm), and the ordinate indicates the y coordinate of the mask surface (unit: nm). FIG. 4 expresses coherence on the mask surface with respect to the origin (0 nm, 0 nm).

Referring to FIG. 4, as a value (color density value) when a highlight portion becomes close to one, the coherence with respect to the origin increases. As the color density value becomes close to zero, the coherence with respect to the origin decreases. For example, positions (±310 nm, 0 nm), (0 nm, ±310 nm), and (±310 nm, ±310 nm) on the mask surface exhibit high coherence with respect to the origin.

The mask data 43 generated using the coherence map 42 will be explained.

Figure 5:
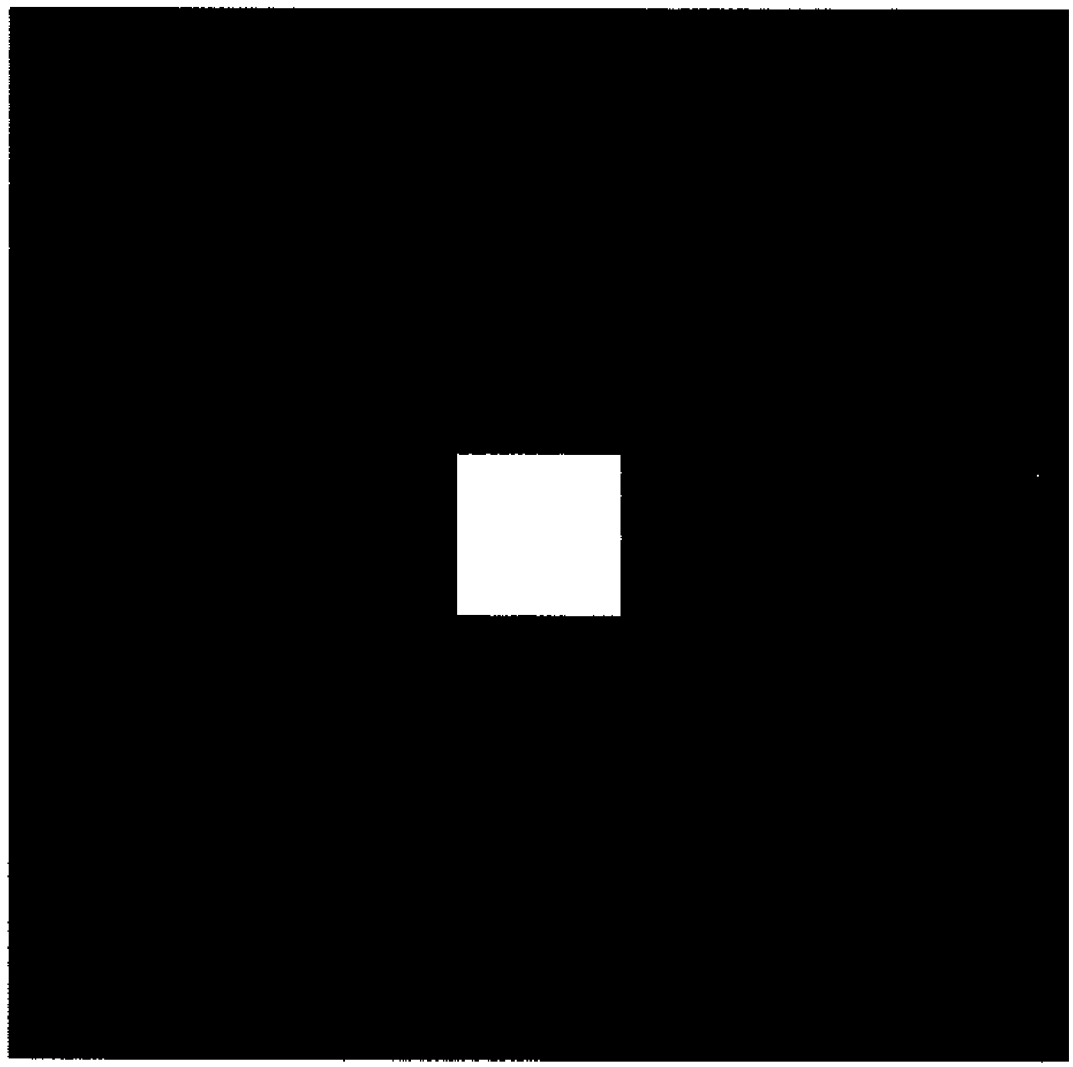
FIG. 5 is a view showing pattern data according to the embodiment of the present invention.

Consider pattern data having an isolated (minute) square contact hole shown in FIG. 5 as an example of the pattern data 41. The NA of the exposure apparatus is 0.73, and the wavelength λ of exposure light is 248 mm. The size of the contact hole is 120 nm. To expose a contact hole, it is a common practice to use a mask pattern including a light-shielding portion and an opening portion (transmitting portion), as shown in FIG. 5. FIG. 5 shows a binary mask (a black portion indicates the transmission portion). The length of one side of the opening portion is 120 nm.

Assume that a pattern of, e.g., Cr, is drawn on the mask directly using the pattern data 41 (layout pattern data) shown in FIG. 5 as the mask data 43. In exposure, light diffracted by the mask pattern forms an image on the photoresist on the wafer surface, and a light intensity distribution gradually changes. Consequently, accurate micropattern formation may not be possible.

Figure 6:
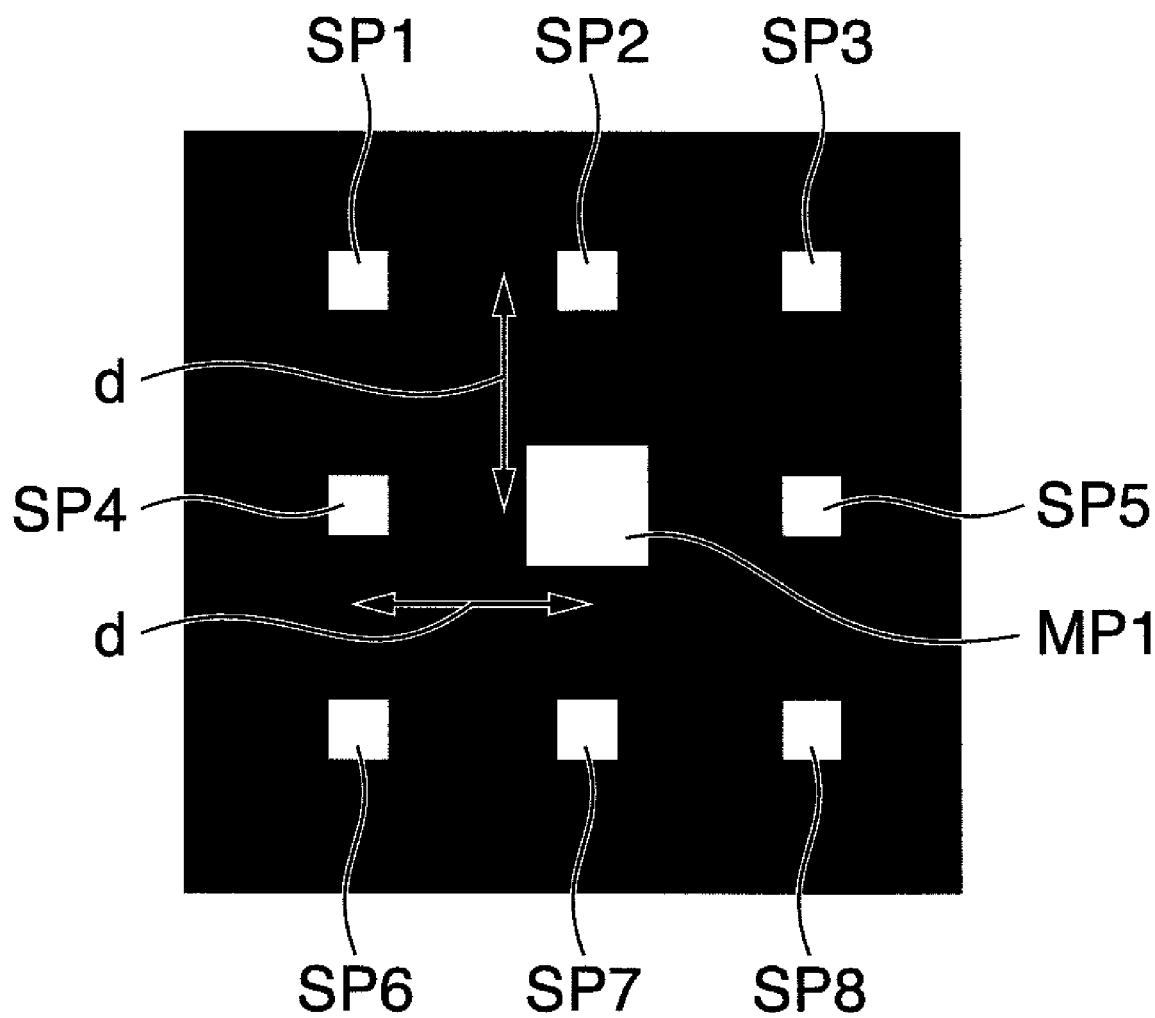
FIG. 6 is a view showing mask data according to the embodiment of the present invention.

To prevent this problem, according to this embodiment, a contact hole pattern as an element of the processing target pattern data 41 (layout pattern data), shown in FIG. 5, is selected as an element of interest. The origin of the coherence map 42 shown in FIG. 4 is matched with the contact hole of the pattern data 41 shown in FIG. 5, so that the contact hole pattern serves as the main pattern. Furthermore, auxiliary patterns are laid out near regions (±310 nm, 0 nm), (0 nm, ±310 nm), and (±310 nm, ±310 nm), where the coherence is equal to or higher than a set value (e.g., 0.7). That is, as shown in FIG. 6, auxiliary patterns SP1 to SP8 are laid out around a main pattern MP1, which is the contact hole pattern in FIG. 5. The intervals between the main pattern MP1 and the auxiliary patterns SP2, SP4, SP5, and SP7 are d=310 nm. The intervals d between the auxiliary patterns SP1, SP3, SP6, and SP8 and their adjacent auxiliary patterns SP2, SP5, SP4, and SP7 are d=310 nm. A pattern of, e.g. Cr, is drawn on the mask using the data shown in FIG. 6 as the mask data 43 (mask fabrication). In exposure, light diffracted by the mask pattern (including the main pattern and auxiliary patterns) forms an image on the photoresist on the wafer surface while maintaining high coherence. Consequently, the imaged light intensity distribution drastically changes. This allows accurate micropattern formation.

Preferably, the size of the auxiliary pattern of the mask data 43, as shown in FIG. 6, is small enough not to resolve, and is desirably 75% that of the main pattern (contact hole pattern) or its neighborhood. The size here means not the area, but the length of one side of a pattern. An example of the size of the main pattern (contact hole pattern) is 120 nm in FIG. 5. That is, the mask data 43 includes a 120-nm square pattern as the main pattern. Accordingly, the size (the length of one side) of the auxiliary pattern is desirably 120 nm×75%=90 nm. In this embodiment, however, the auxiliary patterns are added to high-coherence regions. For this reason, arranging the auxiliary patterns considerably improves the resolution. From this viewpoint, the size of the auxiliary pattern is not limited to 75% that of the main pattern (contact hole pattern) or its neighborhood. Examinations made by the inventors of the present invention have revealed that a sufficient effect can be produced even when the size of the auxiliary pattern is 50% to 85% that of the main pattern (contact hole pattern). That is, even in this case, the auxiliary patterns allow the main pattern to accurately form an image on the wafer surface without being resolved.

It should be noted that the auxiliary pattern may be a rectangular pattern having sides with a length of 50% to 85% and those with a length of 50% to 85%.

Consider the pattern data having an isolated (minute) rectangular contact hole as another example of the pattern data 41. In this case, it suffices to additionally arrange rectangular auxiliary patterns. Assume, for example, that the main pattern (contact hole pattern) has a longer side with a dimension A and a shorter side with a dimension B (<A). Preferably, the auxiliary pattern has a longer side with a dimensions of A×50% to 85%, and a shorter side with a dimension of B×50% to 85%.

Consider isolated (fine) line pattern data as still another example of the pattern data 41. In this case, it suffices to additionally rearrange auxiliary line patterns. Assume, for example, that the main pattern (line pattern) has a length C and a width D (<<C). Since the line pattern is resolved more readily than the contact hole pattern, the auxiliary pattern preferably has a width of D×35% to 70% and a length almost equal to C.

Preferably, the shape of the auxiliary pattern of the mask data 43 is almost similar to that of the main pattern. For example, when the main pattern (e.g., a contact hole pattern) is a square, roughly square auxiliary patterns are preferably added to the mask data 43. When the main pattern (contact hole pattern) is a rectangle, rectangular auxiliary patterns are preferably added to the mask data 43. How to determine another auxiliary pattern shape will be clarified in the embodiments to be described later.

Figure 2:
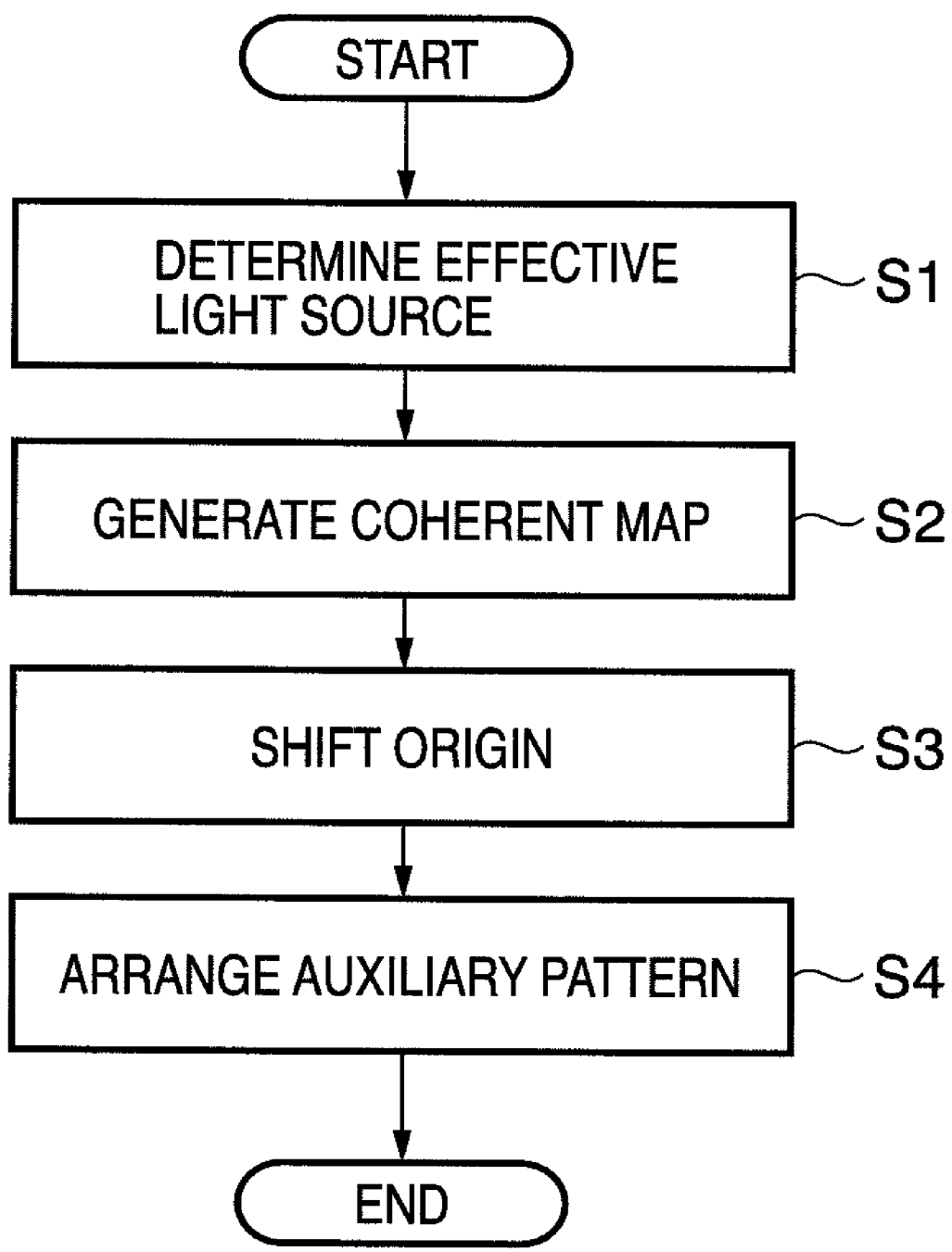
FIG. 2 is a flowchart illustrating a processing sequence for generating mask data by executing a mask data generation program (first working example)

A processing sequence for generating mask data by exacting a mask data generation program will be explained with reference to the flowchart shown in FIG. 2.

In step S1, the control unit 20 of the computer 1 determines an effective light source.

That is, the user inputs information associated with an effective light source (shown in, e.g., FIG. 3) to the input unit 60 in advance. Upon receiving the information associated with the effective light source, the control unit 20 stores it in the storage unit 40 as the effective light source information 44. The pattern data 41, NA information 45, and λ information 46 are also input to the input unit 60 in advance by the user, and stored in the storage unit 40 via the control unit 20.

The recording medium 80, which records the mask data generation program 47, connects to the medium interface 70. The mask data generation program 47 is installed and stored in the storage unit 40 via the control unit 20.

The user inputs an instruction to start-up the mask data generation program 47 to the input unit 60. Upon receiving the instruction to start up the mask data generation program 47, the control unit 20 refers to the storage unit 40 and starts up the mask data generation program 47 on the basis of this instruction. The control unit 20 then controls the display unit 30 to display effective light source information 44 in accordance with the mask data generation program 47. The user having browsed the effective light source information 44 inputs an instruction to select the effective light source to the input unit 60. On the basis of the effective light source information 44 and the instruction to select the effective light source, the control unit 20 determines the effective light source intensity distribution (see FIG. 3) and holds the determined effective light source information.

In step S2, the control unit 20 of the computer 1 generates a coherence map 42.

That is, the user inputs an instruction to generate a coherence map 42 to the input unit 60. Upon receiving the instruction to generate a coherence map 42, the control unit 20 refers to the storage unit 40 and receives the NA information 45 and λ information 46 on the basis of this instruction. On the basis of the effective light source information, the control unit 20 generates a function indicating the effective light source. On the basis of the NA information 45 and λ information 46, the control unit 20 Fourier-transforms the function indicating the effective light source to generate coherence map 42 (see FIG. 4). The control unit 20 then controls the display unit 30 to display the coherence map 42.

In step S3, the control unit 20 of the computer 1 shifts the origin of the coherence map 42.

That is, the user inputs an instruction to display the pattern data 41 to the input unit 60. Upon receiving the instruction to display the pattern data 41, the control unit 20 refers to the storage unit 40 and controls the display unit 30 to display the pattern data 41, on the basis of this instruction. With this operation, the display unit 30 simultaneously displays the pattern data 41 and coherence map 42. The user having browsed the pattern data 41 and coherence map 42 inputs an instruction to select an element of interest (of the pattern data 41) to the input unit 60. Upon receiving the instruction to select the element of interest, the control unit 20 shifts the origin of the coherence map 42 to the center of the element of interest of the pattern data 41 and matches them on the basis of this instruction. The control unit 20 then controls the display unit 30 to display the pattern data 41 and the coherence map 42 with the origin being shifted. In addition, the control unit 20 generates mask data 43 using the element of interest as the main pattern, and stores it in the storage unit 40.

In step S4, the control unit 20 of the computer 1 arranges an auxiliary pattern.

That is, the user, having browsed the pattern data 41 and the coherence map 42, with the origin being shifted, inputs an instruction to arrange an auxiliary pattern to the input unit 60. Upon receiving the instruction to arrange the auxiliary pattern, the control unit 20 additional arranges the auxiliary pattern in a region where the coherence is equal to or higher than a set value, on the basis of this instruction. The control unit 20 refers to the storage unit 40 and sets the mask data 43, including the auxiliary pattern information, as new mask data 43. The control unit 20 then controls the display unit 30 to display the mask data 43 in place of the pattern data 41. In addition, the control unit 20 stores the mask data 43 in the storage unit 40. As described above, the process by the mask data generation program 47, according to this embodiment, can generate, using the coherence map 42, mask data 43, in which auxiliary patterns are arranged at appropriate positions. That is, the process by the mask data generation program 47 can generate mask data 43 in which auxiliary patterns are arranged at appropriate positions, without calculating either the TCC or eigenfunction, thus simplifying the entire numerical calculation. This makes it possible to shorten the generation time of the mask data 43.

When an EB drawing apparatus receives the mask data 43, it can draw a pattern of, e.g., Cr, corresponding to the mask data 43 on a mask 130. This makes it possible to fabricate the mask 130. It should be noted that the mask data may include other patterns, except the patterns generated using the coherence map, and that the mask being drawn the patterns, including the other patterns, may be fabricated.

Working examples of the present invention will be explained below.

First Working Example

Figure 7:
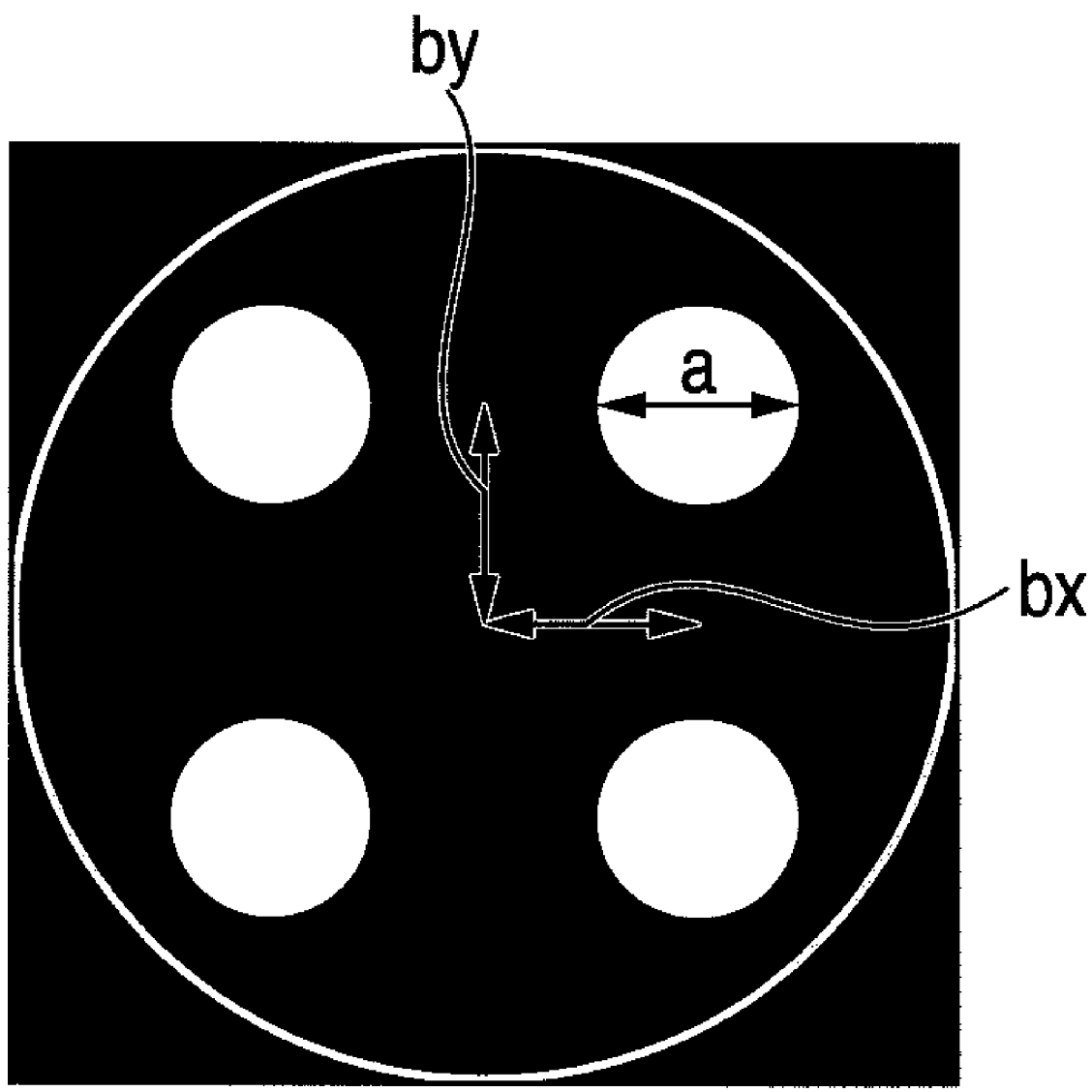
FIG. 7 is a view showing an effective light source according to the first working example of the present invention.

Consider pattern data having an isolated (minute) square contact hole shown in FIG. 5 as an example of pattern data 41. The NA of an exposure apparatus 11 (see FIG. 28) is 0.73, and the wavelength λ of exposure light is 248 nm. The size of the contact hole is 120 nm. An effective light source has an appearance as shown in FIG. 7. A circle, which has a radius of one and is drawn by a white line shown in FIG. 7, indicates σ=1. White portions indicate light irradiated portions, which are called poles in this specification. The distance from σ=0 to the center of each pole is given such that the distance in the abscissa direction, i.e., x direction, is bx=0.55 (upon conversion into a σ value). A diameter a of each pole is 0.2 when converting the diameter into a σ value indicates a magnitude obtained by normalization, assuming that the radius of the pupil of a projection optical system is one.

Figure 8:
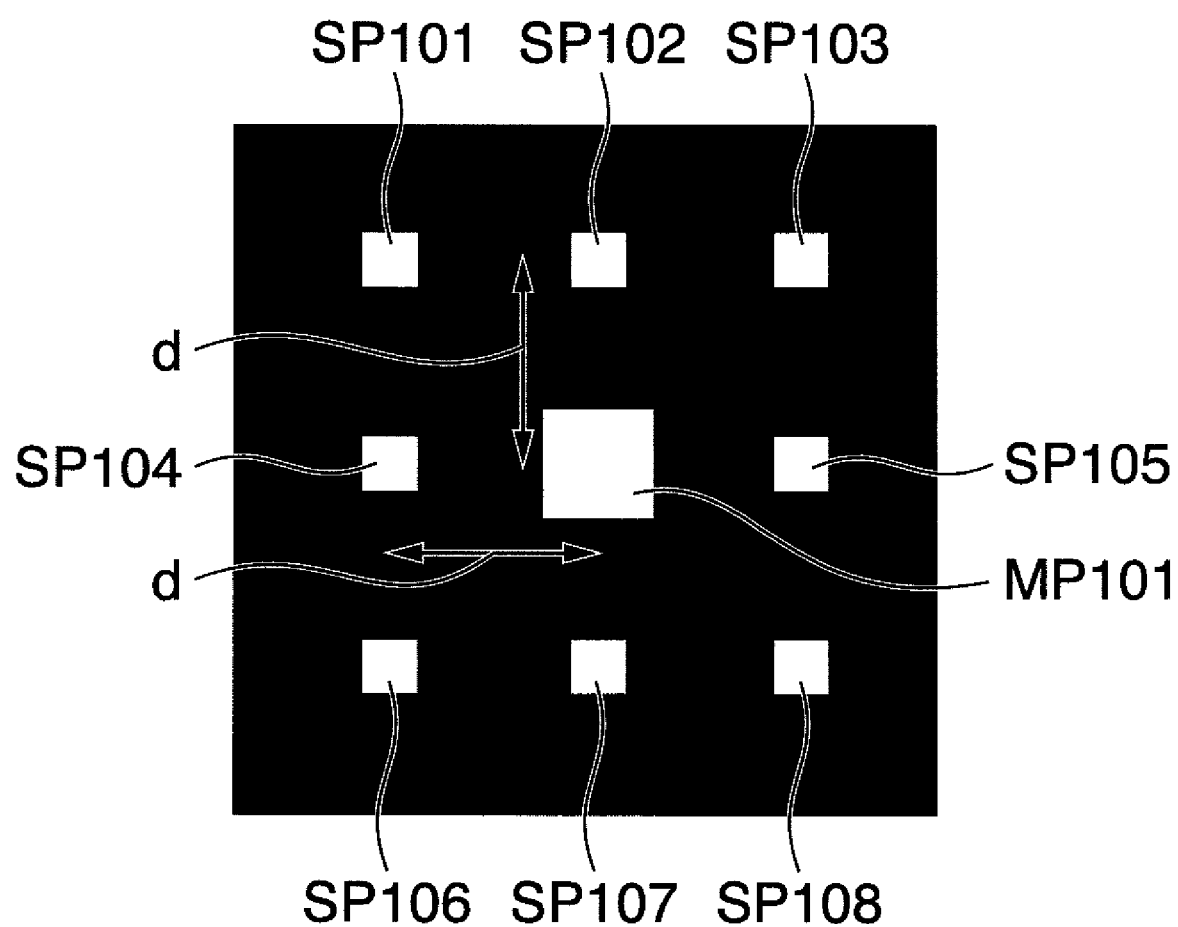
FIG. 8 is a view showing mask data according to the first working example of the present invention.
Figure 9:
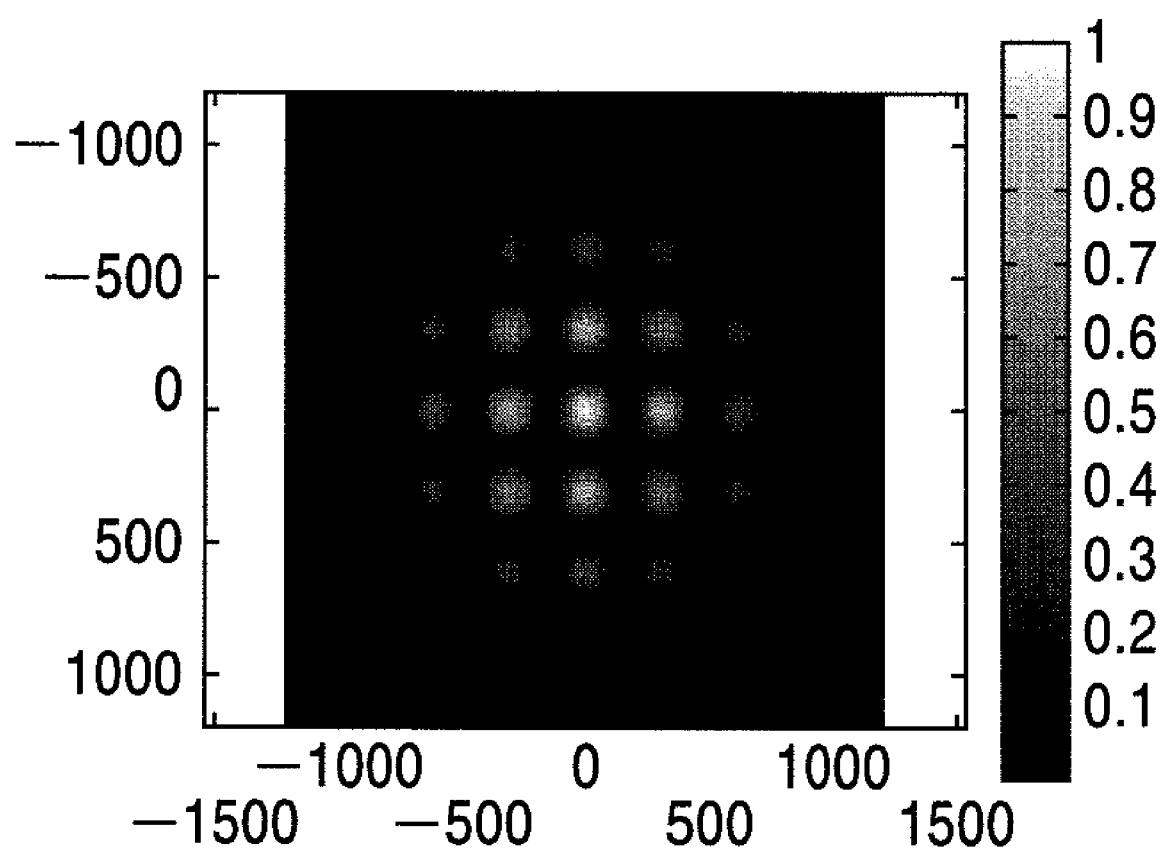
FIG. 9 is a graph showing a coherence map according to the first working example of the present invention.
Figure 10:
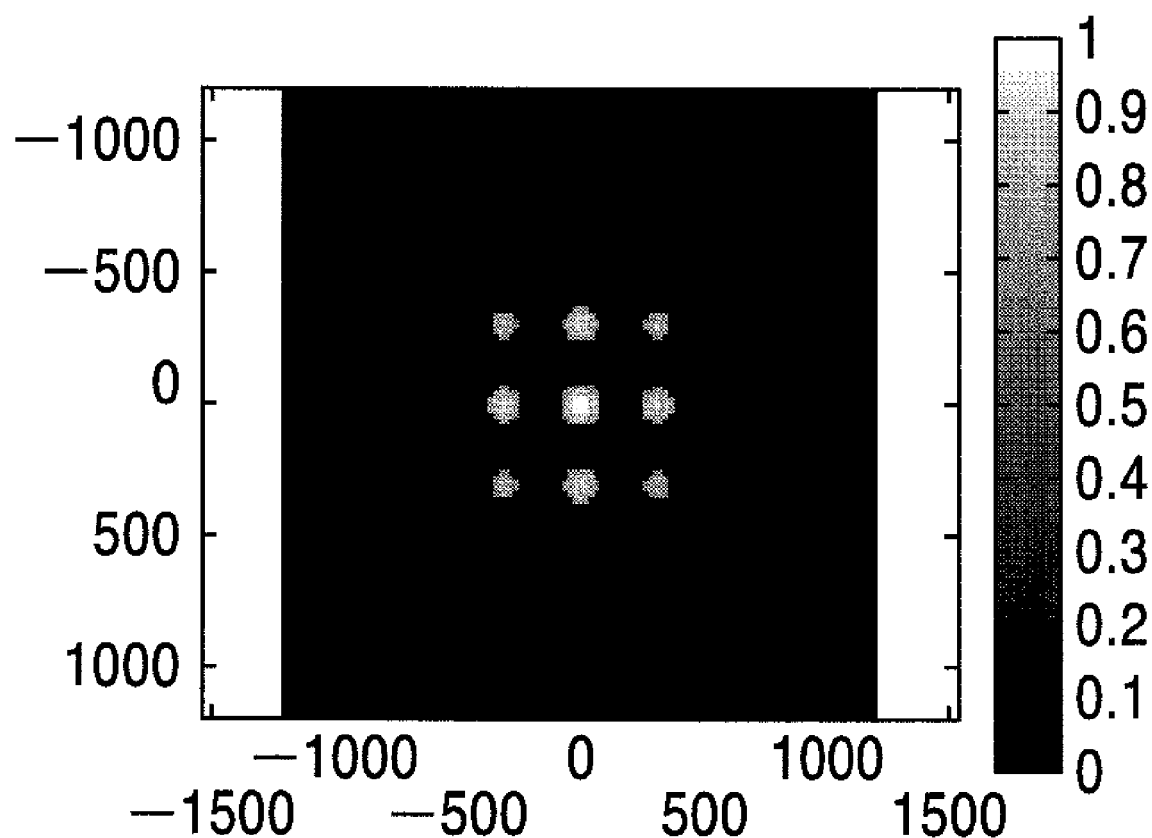
FIG. 10 is a graph showing regions where the coherence is equal to or higher than a set value in the coherence map, according to the first working example of the present invention.

First, a control unit 20 generates a coherence map 42, as shown in FIG. 9. The scale of FIG. 9 is identical to that shown in FIG. 4. Next, the control unit 20 determines the coherence threshold value (set value). For example, the control unit 20 determines the coherence set value as 0.5. FIG. 10 shows regions where the coherence exceeds 0.5 (set value) in the coherence map 42. Positions where the coherence exceeds the threshold value (set value) and corresponds to a peak are (±310 nm, 0 nm), (0 nm, ±310 nm), and (±310 nm, ±310 nm) on the mask. In view of this, the control unit 20 arranges a main pattern MP101 at the origin of mask data 43, shown in FIG. 8, and arranges auxiliary patterns SP101 to SP108 at an interval d=310 nm.

The simulation result of the imaging characteristic of a mask without any auxiliary patterns is compared with that of a mask fabricated by the auxiliary pattern intersection method, according to this working example.

Figure 11:
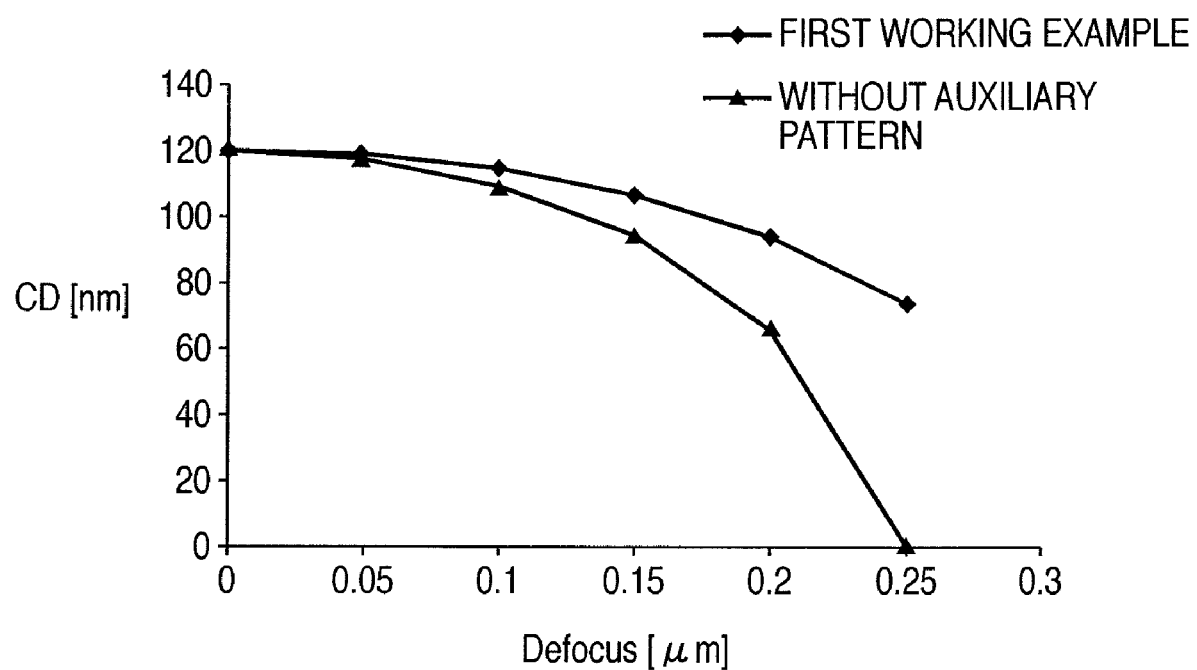
FIG. 11 is a graph showing the simulation result of the imaging characteristics according to the first working example of the present invention.

FIG. 11 shows the simulation result of imaging characteristics. Referring to FIG. 11, the abscissa indicates the defocus amount, and the ordinate indicates the hole diameter (CD; Critical Dimension). The imaging performance of a mask without any auxiliary patterns is compared with that of a mask fabricated by the mask data generation method, according to this working example, dramatically decreases a change in hole diameter as a function of the defocus. That is, this working example is advantageous to accurate micropattern formation, owing to an improvement in imaging characteristic.

According to this working example, the coherence map 42 is calculated, and the auxiliary patterns are arranged at positions where the coherence exceeds the threshold value (set value) and corresponds to a peak, thus improving the imaging characteristic. This allows accurate micropattern formation.

Second Working Example

The first working example has exemplified the case wherein the pattern data 41 includes one element. However, the second working example will exemplify a case wherein pattern data 41 includes a plurality of elements.

Consider, for example, n (n is a natural number equal to or larger than 2) contact hole patterns scattered on the pattern data 41.

A coherence map 42 is an estimate of the degree of interference with the origin. That is, the coherence map 42 expresses the coherence between a certain point and the origin. As described in the first working example, the use of the coherence map 42 allows for an improvement in imaging performance.

Figure 12:
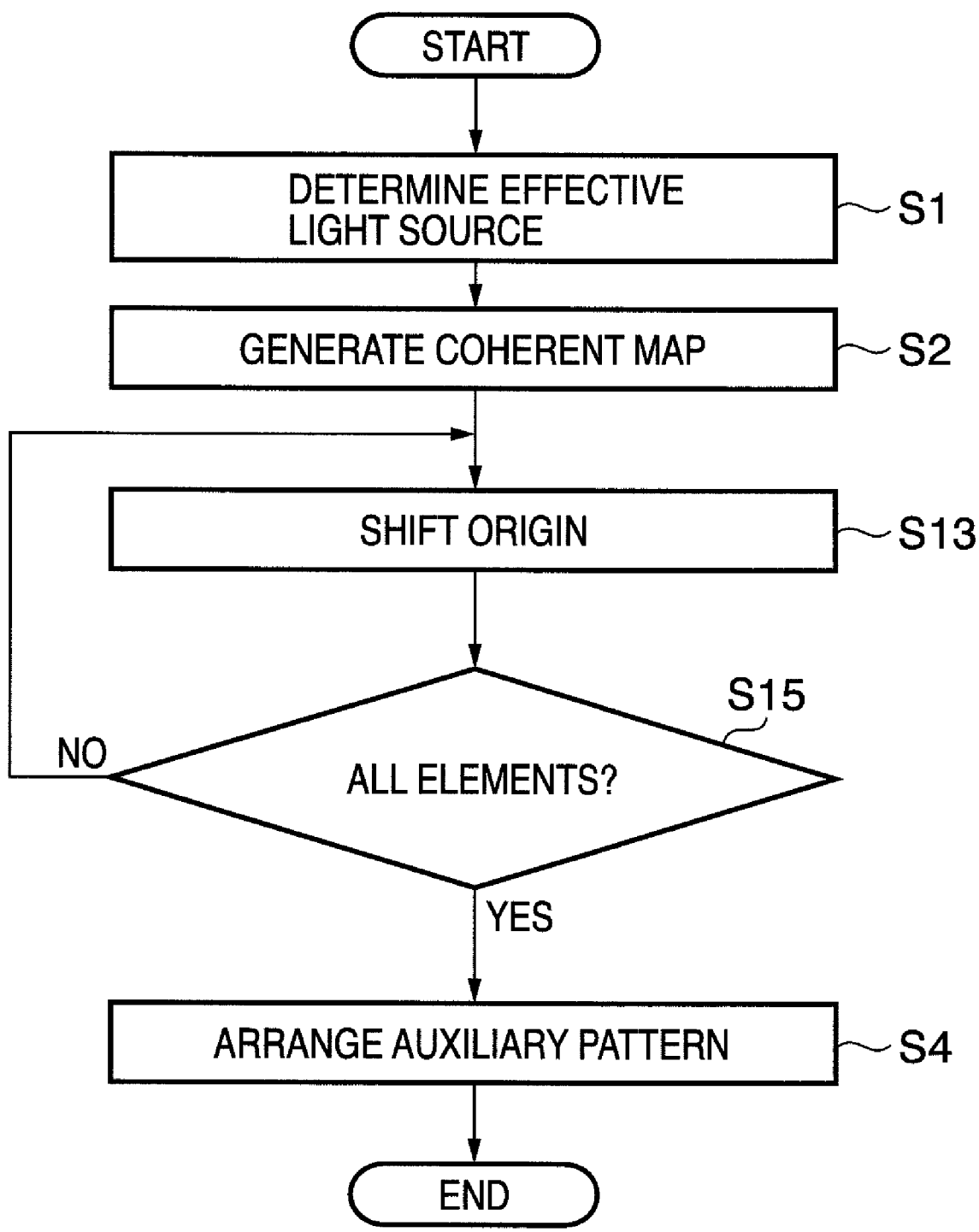
FIG. 12 is a flowchart illustrating a processing sequence for generating mask data by executing a mask data generation program (second working example)

When n contact hole patterns exist, they are individually processed as elements of interest. That is, a processing sequence for generating mask data by executing a mask data generation program, shown in FIG. 12, is different from that shown in FIG. 2, in the following points. FIG. 12 is a flowchart illustrating a processing sequence for generating mask data by executing a mask data generation program.

In step S13, the user having browsed the pattern data 41 and coherence map 42 inputs an instruction to select an element of interest from unselected contact holes of the n contact holes to an input unit 60. A control unit 20 adds the coherence map 42 with the origin being shifted to the center of the element of interest to a synthetic coherence map 42$i$ (i is a natural number) to generate a new synthetic coherence map 42$i$+1. The synthetic coherence map 42$i$ is obtained by overlapping coherence maps 42 for i elements of interest. Other points are the same as those in step S3, shown in FIG. 2.

In step S15, the control unit 20 determines whether all the elements of the pattern data 41, i.e., all of the n contact holes have been selected. If the control unit 20 determines that all of the n contact holes have been selected, the process advances to step S4. If the control unit 20 determines that not all of the n contact holes have been selected, the process returns to step S13.

The process shown in FIG. 12 is formulated by equation (1). That is, letting f(x, y) be the coherence map 42, and (xi, yi) be the coordinate position of the center position of an i$^{th}$ contact hole pattern, it suffices to determined, as a synthetic coherence map 42$n$, F1($x$, y) given by:

$$F1(x,y)=\Sigma f(x-xi,y-yi) \tag{1}$$

where i=1 to n. Then, as described in the first working example, it suffices to arrange auxiliary patterns at positions where F1($x$, y) exceeds a predetermined threshold value and corresponds to a peak, thus improving the imaging characteristic. In this manner, synthetic coherence maps corresponding to a plurality of elements are generated to arrange auxiliary patterns using these maps. This makes it possible to accurately form a micropattern including a plurality of elements.

Third Working Example

The first working example has exemplified the case wherein an element included in the pattern data 41 is a square pattern. However, the third working example will exemplify a case wherein an element included in pattern data 41 is a rectangular or a line pattern.

A method of arranging an auxiliary pattern by regarding a rectangular or a linear pattern as a set of square patterns will be explained first.

An element of interest selected by a control unit 20 is not limited to a square contact hole pattern. The element of interest may be, e.g., a rectangular contact hole pattern or a line pattern.

If, for example, the element of interest is a rectangular contact hole pattern, it suffices to regard it as a line. Note that the line passes through the center of the pattern in the shorter side direction and extends in the longer side direction. The length of the line is equal to the dimension of the mask pattern in the longer side direction.

Figure 14:
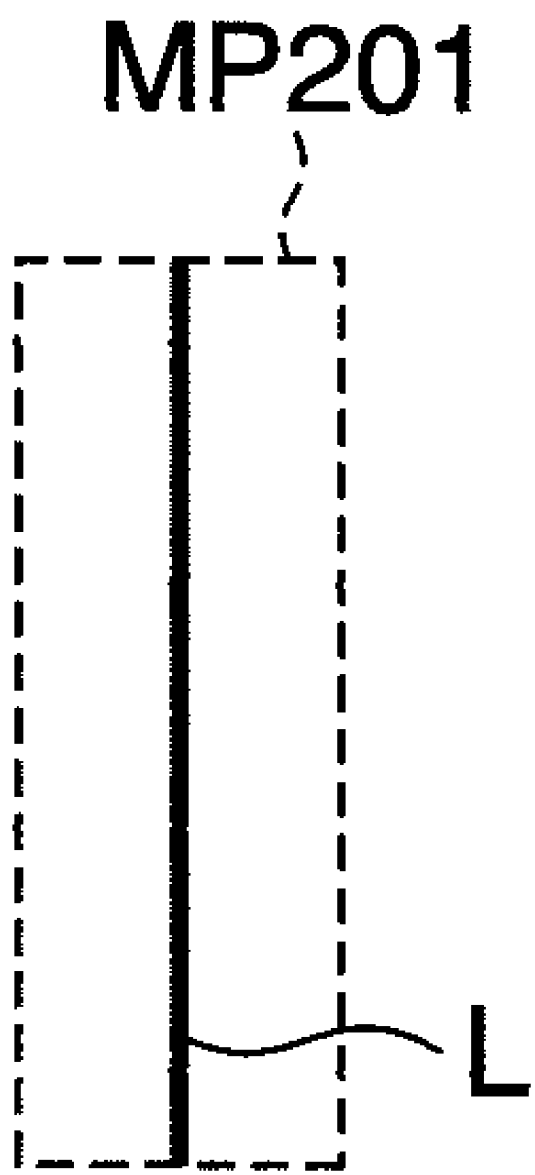
FIG. 14 is a view showing another pattern data according to the third working example of the present invention.

For example, the control unit 20 forms a line L, as shown in FIG. 14, for a rectangular contact hole pattern MP201. Along the obtained line L, the control unit 20 adds coherence maps 42 to generate a synthetic coherence map 42L.

That is, the line L is described by a function 1($x$, y). Note that 1($x$, y) is 1 on the line, but is 0 at positions other than the line. The synthetic coherence map 42L is given by:

$$F2(x,y)=\iint 1(x,y)f(x,y)dxdy \tag{2}$$

where f(x, y) is the coherence map 42. In equation (2), a multiple integral is performed for the function 1(x, y) indicating the line L.

Then, as described in the first working example, it suffices to insert auxiliary patterns in positions where F2(x, y) exceeds a predetermined threshold value and corresponds to a peak, thus improving the imaging characteristic.

A method of arranging an auxiliary pattern on the basis of an effective light source suitable for a rectangular or a linear pattern will be explained next.

Figure 15:
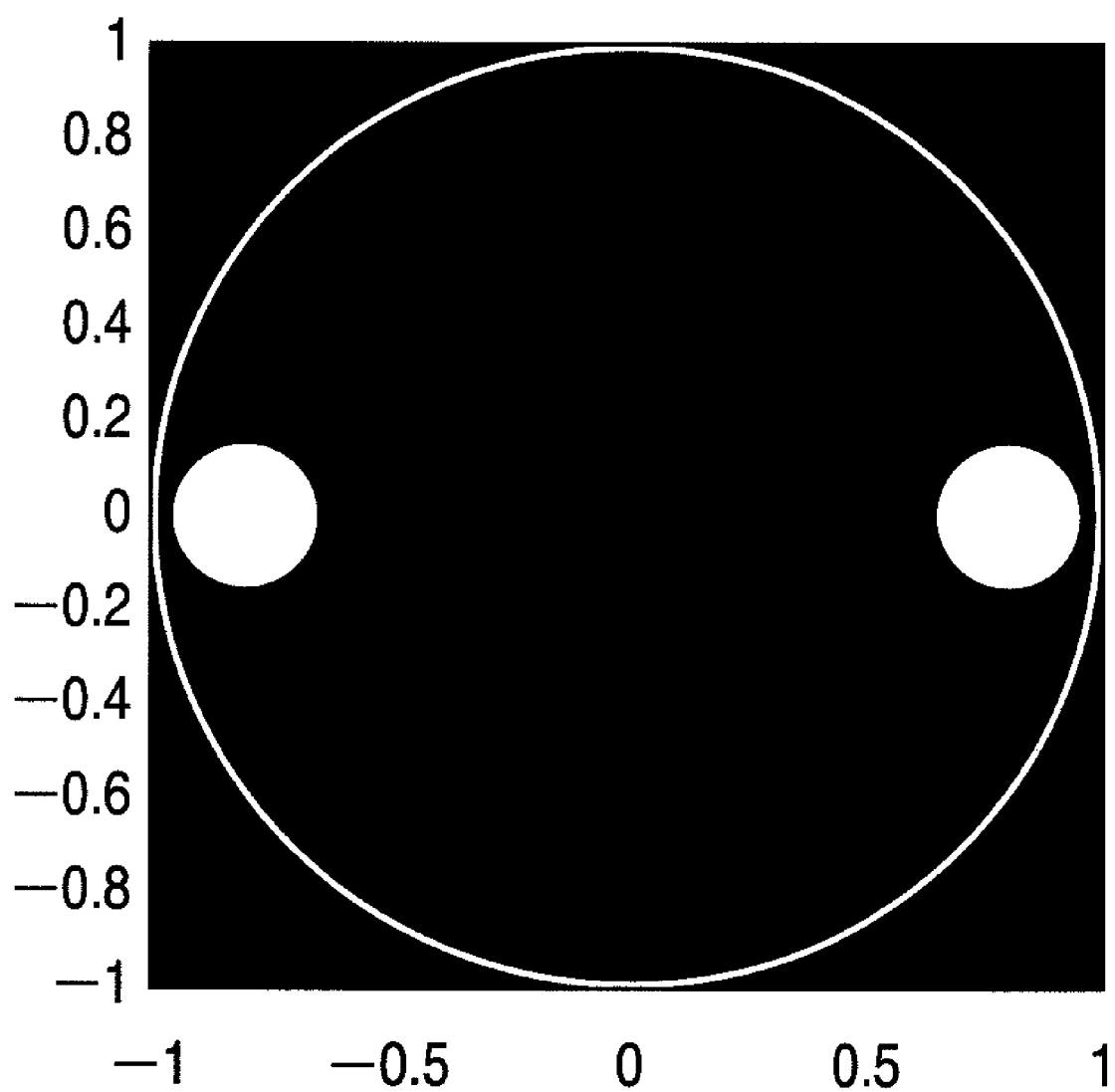
FIG. 15 is a graph showing an effective light source according to the third working example of the present invention.

Assume, for example, that the NA of an exposure apparatus 100 (see FIG. 28) is 0.73, and the wavelength λ of exposure light is 248 nm. The shorter side of the contact hole is 110 nm. The control unit 20 determines a dipole effective light source, as shown in FIG. 15. White portions indicate light irradiated regions, and a circle, which has a radius of one and is drawn by a white line, indicates σ=1. The distance from σ=0 to the center of each pole in the abscissa direction is 0.8 when converting the distance into a σ value, and the diameter of each pole is 0.3 when converting the diameter into a σ value.

On the basis of NA information 45 and λ information 46, the control unit 20 Fourier-transforms a function indicating the effective light source, shown in FIG. 15, to generate a coherence map 42, shown in FIG. 4. The coherence map 42, shown in FIG. 16, has parallel coherence peaks in the abscissa direction, i.e., x direction, at a pitch of 213 nm.

Figure 13:
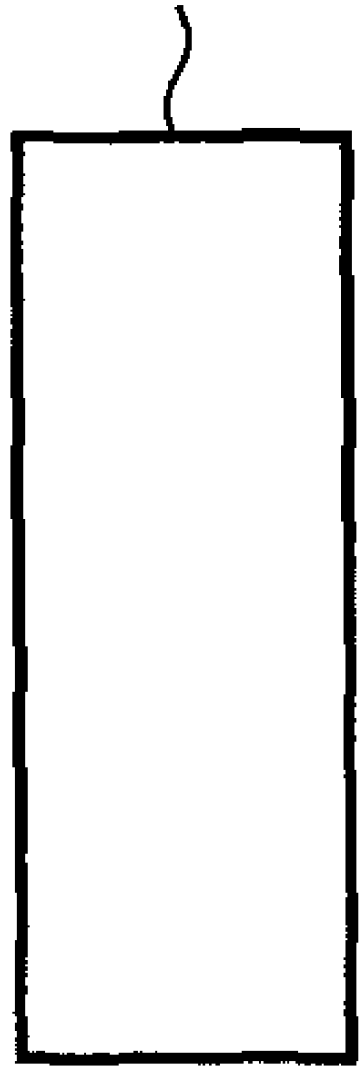
FIG. 13 is a view showing pattern data according to the third working example of the present invention.
Figure 16:
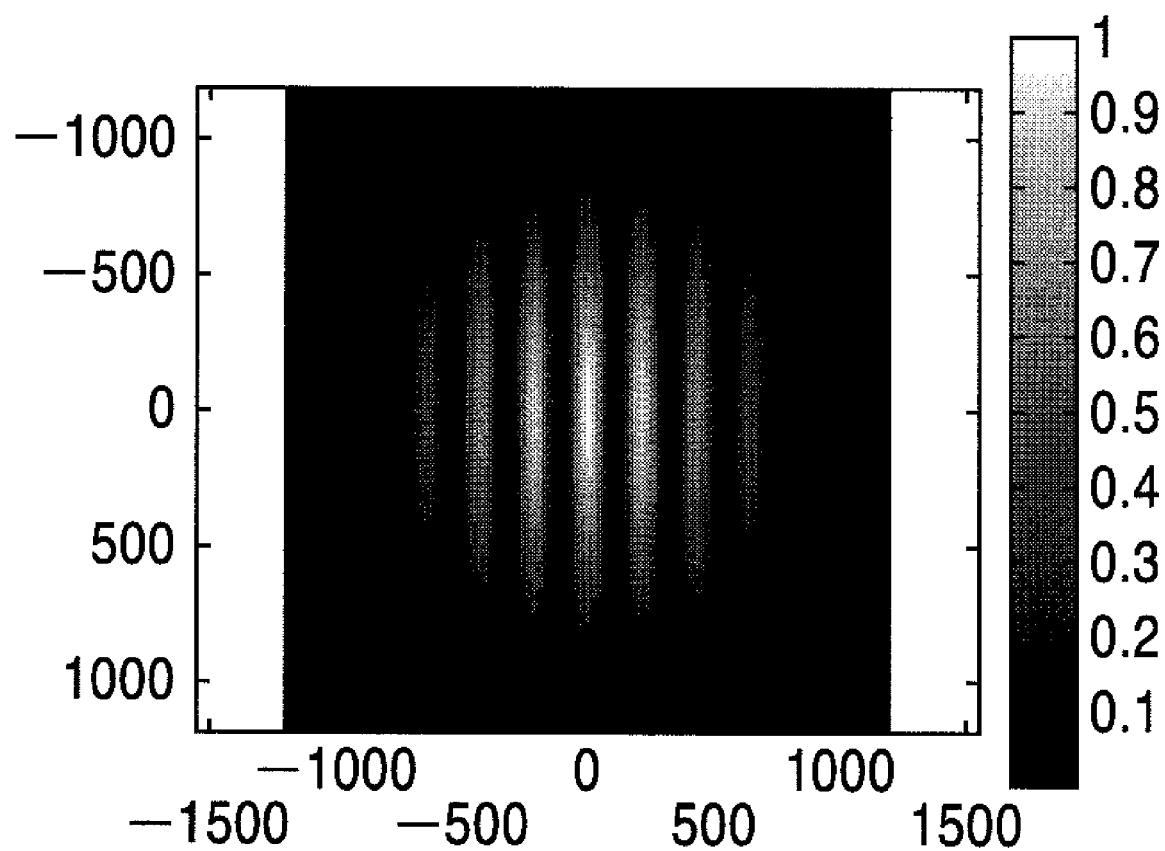
FIG. 16 is a graph showing a coherence map according to the third working example of the present invention.
Figure 17:
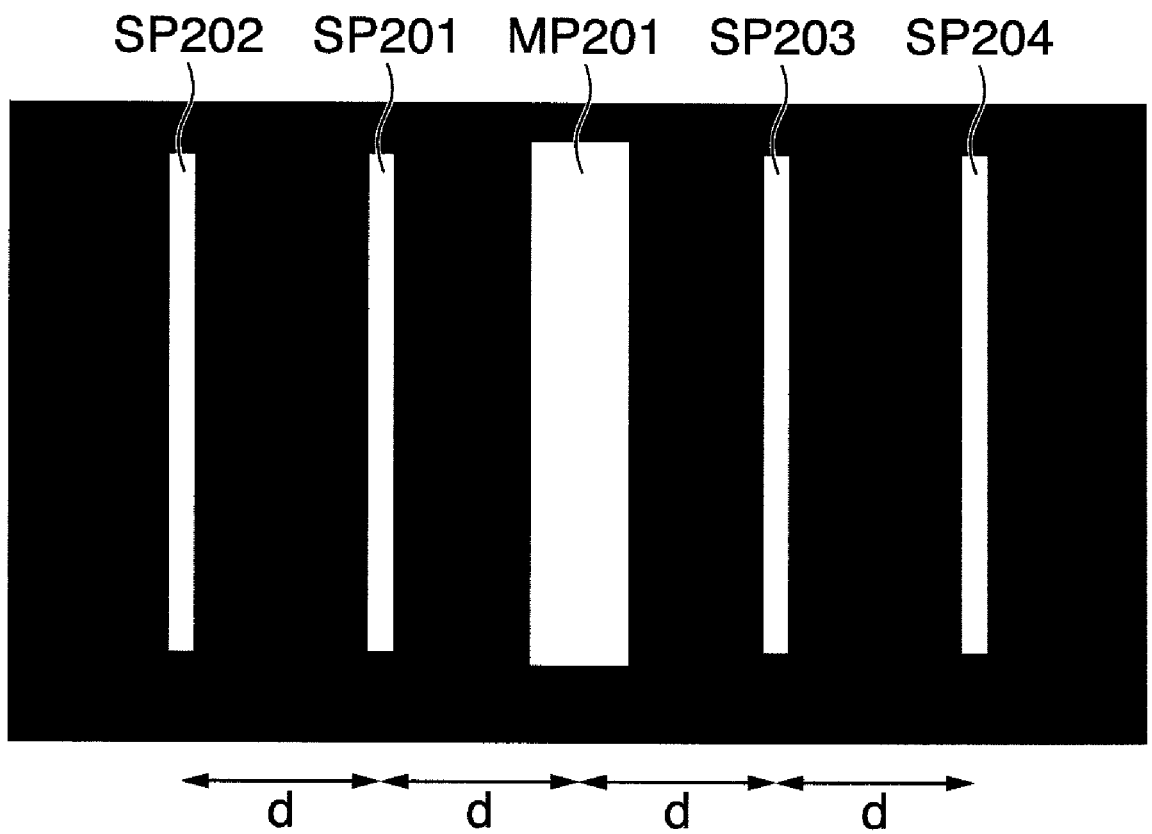
FIG. 17 is a view showing mask data according to the third working example of the present invention.

The control unit 20 matches the origin of the coherence map 42, shown in FIG. 16, with the position of an element (contact hole pattern MP201) of interest of the pattern data 41, shown in FIG. 13. The control unit 20 arranges the main pattern MP 201 at the origin of mask data 43, and arranges auxiliary patterns SP201 to SP204 in regions where the coherence is equal to or higher than a set value. Hence, as shown in FIG. 17, the auxiliary patterns SP201 to SP204 are arranged on both sides of the main pattern MP201 in the mask data 43 at a pitch d=213 nm.

In this manner, a coherence map corresponding to a rectangular or a line element is generated to arrange auxiliary patterns using the resultant coherence map. This makes it possible to accurately form a rectangular or a linear micropattern.

Fourth Working Example

The coherence maps 42 defined by equations (1) and (2) are derived on the basis of points or lines. That is, in the above-described working examples, a square contact hole pattern is regarded as a set of points and a rectangular contact hole pattern is regarded as a set of points, and a rectangular contact hole pattern or a line pattern is regarded as a set of lines, to derive the coherence map 42. This method is effective when the size of a target contact hole is small or the width of a line is narrow.

However, an actual contact hole has a finite size, and an actual line also has a finite width. In view of this, a method of deriving a coherence map 42 (to be referred to as a finite-size coherence map hereafter) will be explained by taking finite sizes into consideration.

Consider a square contact hole pattern having sides with a length e. The square contact hole pattern can be expressed by Rect(x/e, y/e3). Rect(x, y) is a function which indicates a square contact hole pattern and takes 1 if |x|≦½ and |y|≦½, and otherwise, takes 0.

F3(x, y) indicating the finite-size coherence map 42 for the square contact hole pattern is given by:

$$F3(x,y)=\iint Rect(x/e,y/e)f(x,y)dxdy \quad (3)$$

where f(x, y) is a function indicating the coherence map 42. That is, a control unit 20 multiplies a coherence map 42 defined for points by a function indicating the square contact hole pattern and integrates the product to obtain a function F3(x, y) indicating the finite-size coherence map 42.

When n square contact hole patterns exist, the control unit 20 performs an arithmetic process by replacing f(x, y) by F3(x, y) in equation (1). This makes it possible to obtain a coherence map 42 indicated by F1(x, y), i.e., an infinite-size coherence map 42 formed by the n square contact hole patterns.

The control unit 20 may derive F3(x, y), indicating the finite-size coherence map 42, for a rectangular contact hole pattern. Let e1 be the length of a side of the rectangle in the x direction, and e2 be the length of a side in the y direction. Then, the control unit 20 derives F3(x, y) by replacing Rect (x/e, y/e) by Rect(x/e1, y/e2). This makes it possible to obtain a finite-size coherence map 42 for the rectangular contact hole pattern.

When n rectangular contact hole patterns exist, the control unit 20 performs an arithmetic process by replacing f(x, y) by F3(x, y) in equation (1). This makes it possible to obtain a coherence map 42 indicated by F1(x, y), i.e., an infinite-size coherence map 42 formed by the n rectangular contact hole patterns.

The control unit 20 may calculate the finite-size coherence map 42 by regarding a rectangular contact hole pattern as a set of square contact hole patterns. That is, the control unit 20 replaces Rect(x/e, y/e) by Rect(x/e1, y/e1) in equation (3) if e1 is smaller than e2. The control unit 20 calculates F4(x, y) indicating the finite-size coherence map 42 for the square contact hole pattern. The control unit 20 prepares a line which passes through the center of the pattern in the shorter side direction, extends in the longer side direction, and has a length e2. The control unit 20 calculates F2(x, y) indicating the finite-size coherence map 42 for the rectangular contact hole pattern by replacing f(x, y) by F4(x, y) using 1(x, y) as a function indicating the line with the length e2 in equation (2).

Likewise, the control unit 20 may calculate the finite-size coherence map 42 by regarding a line pattern as a set of square contact hole patterns.

As another form, the control unit 20 may multiply a function indicating a side of a layout pattern by the function indicating the coherence map 42 and integrate the product to derive the finite-size coherence map 42, which can enhance the side of the mask pattern.

In this manner, auxiliary patterns are arranged using a coherence map corresponding to even a finite-size element. This makes it possible to accurately form a micropattern on a wafer.

Fifth Working Example

The normal van Cittert-Zernike theorem does not take the influence of polarization into consideration. In recent years, however, the influence of polarization is becoming non-negligible in exposing a pattern whose factor k1 is small.

In view of this, the inventors of the present invention propose a method of incorporating the polarization effect into the van Cittert-Zernike theorem. More specifically, a control unit 20 derives the van Cittert-Zernike theorem by applying the NA of a projection optical system to the a value of an effective light source, and three-dimensionally expressing polarized light to be condensed. That is, the control unit 20 performs Fourier transformation by multiplying a function indicating an effective light source by a factor associated with polarization. Polarization factors include a factor which allows x-polarized light to remain as x-polarized, one which turns x-polarized light into y-polarized light, one which turns x-polarized light into z-polarized light, one which turns y-polarized light into x-polarized light, one which allows y-polarized light to remain as y-polarized, and one which turns y-polarized light into z-polarized light. The function obtained by multiplying the function indicating the effective light source by a polarization factor maintains the characteristics of the effective light source.

A coherence map 42, which incorporates the polarization effect, will be exemplified.

Figure 18:
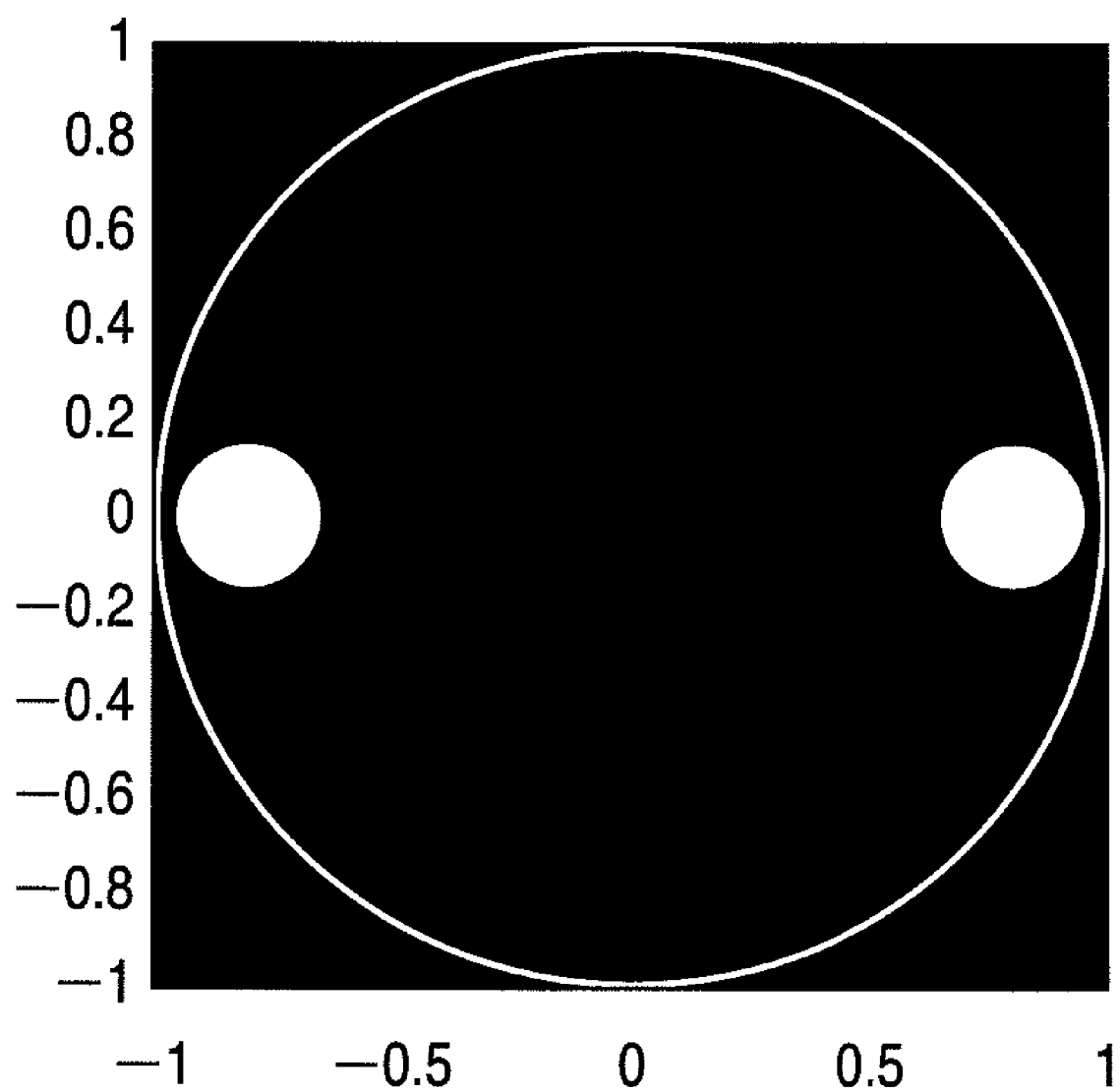
FIG. 18 is a graph showing an effective light source according to the fifth working example of the present invention.

Consider a case wherein the NA of an exposure apparatus is 0.73, and the wavelength λ of exposure light is 248 nm. Assume a dipole effective light source, as shown in FIG. 18. White portions indicate light irradiated regions, and a circle, which has a radius of one and is drawn by a white line, indicates σ=1. The distance from σ=0 to the center of each pole in the abscissa direction is 0.8 when converting the distance into a σ value, and the diameter of each pole 0.3 when converting the diameter into a σ value.

Figure 19:
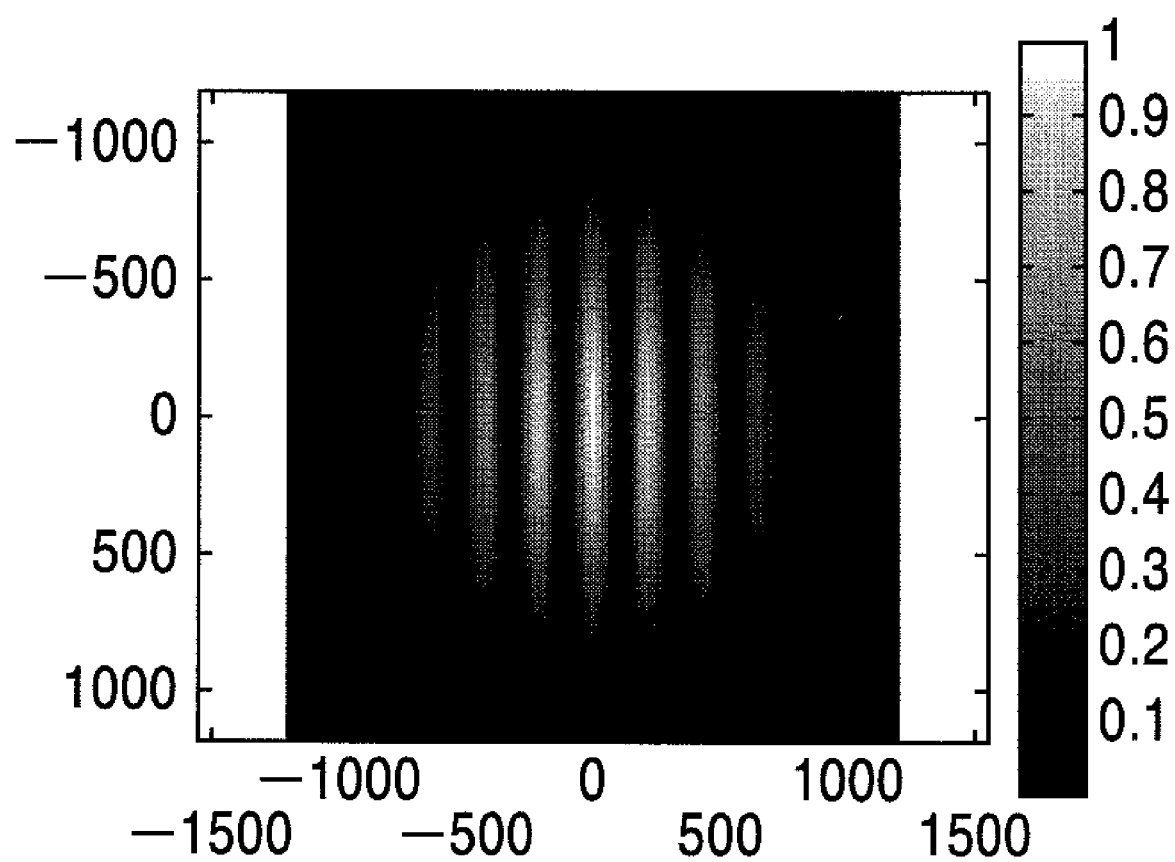
FIG. 19 is a graph showing a coherence map according to the fifth working example of the present invention.
Figure 20:
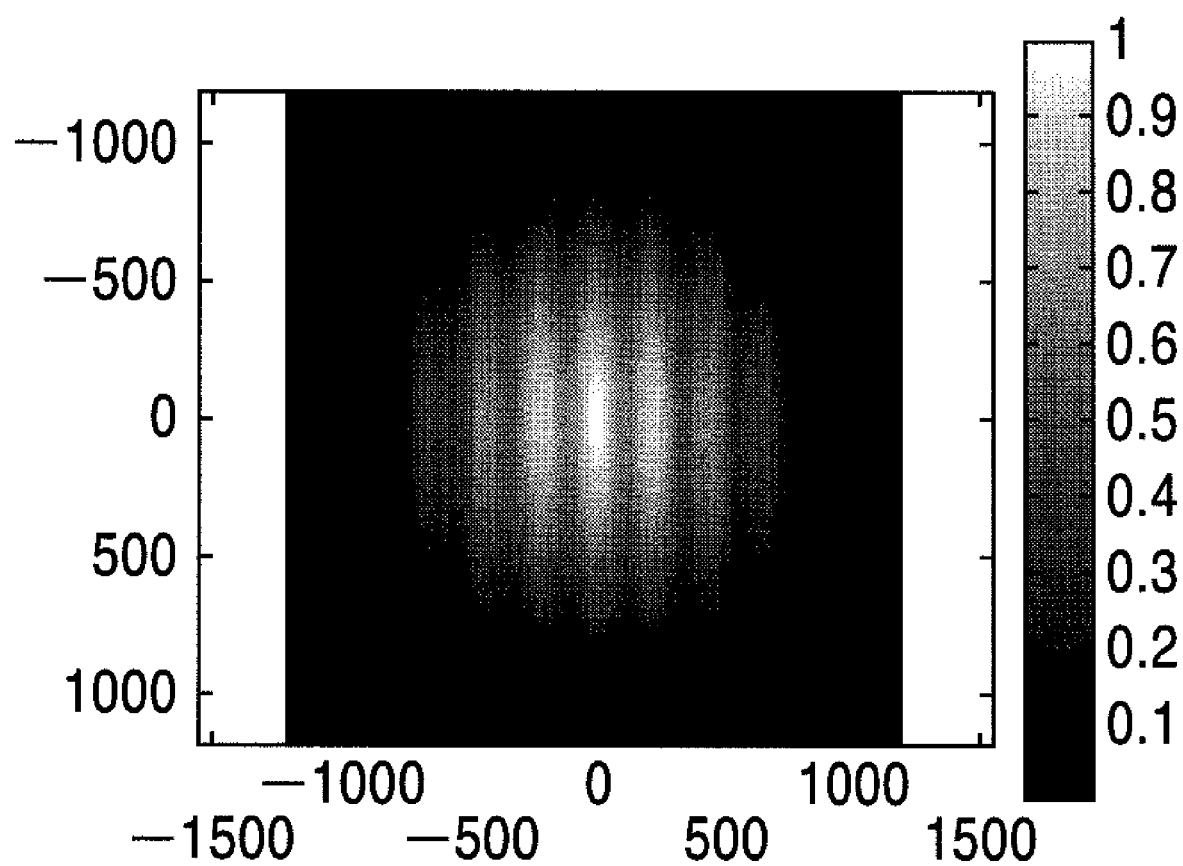
FIG. 20 is a graph showing another coherence map according to the fifth working example of the present invention.

For example, the control unit 20 performs Fourier transformation by multiplying a function indicating an effective light source by a y-polarized light (S-polarized light) factor to generate a coherence map 42 shown in FIG. 19. The scale of FIG. 19 is identical to that shown in FIG. 4. For example, the control unit 20 performs Fourier transformation by multiplying a function indicating an effective light source by an x-polarized light (P-polarized light) factor to generate a coherence map 42 shown in FIG. 20. The scale of FIG. 20 is identical to that shown in FIG. 19. A comparison between the coherence map 42 shown in FIG. 19 and that shown in FIG. 20 reveals that regions with high coherence can be clearly distinguished from those with low coherence with y-polarized light, but not with x-polarized light. With this phenomenon, arranging auxiliary patterns in regions with high y-polarized light allows accurate micropattern information. On the other hand, it is ineffective to arrange auxiliary patterns for x-polarized light.

It should be noted that the polarization state also includes a non-polarized state (i.e., a state wherein polarization randomly changes). It is also possible to regard a coherence map 42 obtained by the conventional scalar approximation as a coherence map 42, which incorporates the polarization effect and does not contain polarized light.

In this manner, according to this working example, a coherence map is generated by taking the influence of polarization into consideration, to arrange auxiliary patterns using this map. This makes it possible to accurately form a micropattern on a wafer.

Sixth Working Example

A control unit 20 may optimize an effective light source. That is, the control unit 20 determines an effective light source, such that a peak (a region where the coherence is equal to or higher than a set value) of a coherence map 42 matches the position of an element of pattern data 41. With this operation, the effective light source becomes suitable for accurate micropattern formation.

Figure 22:
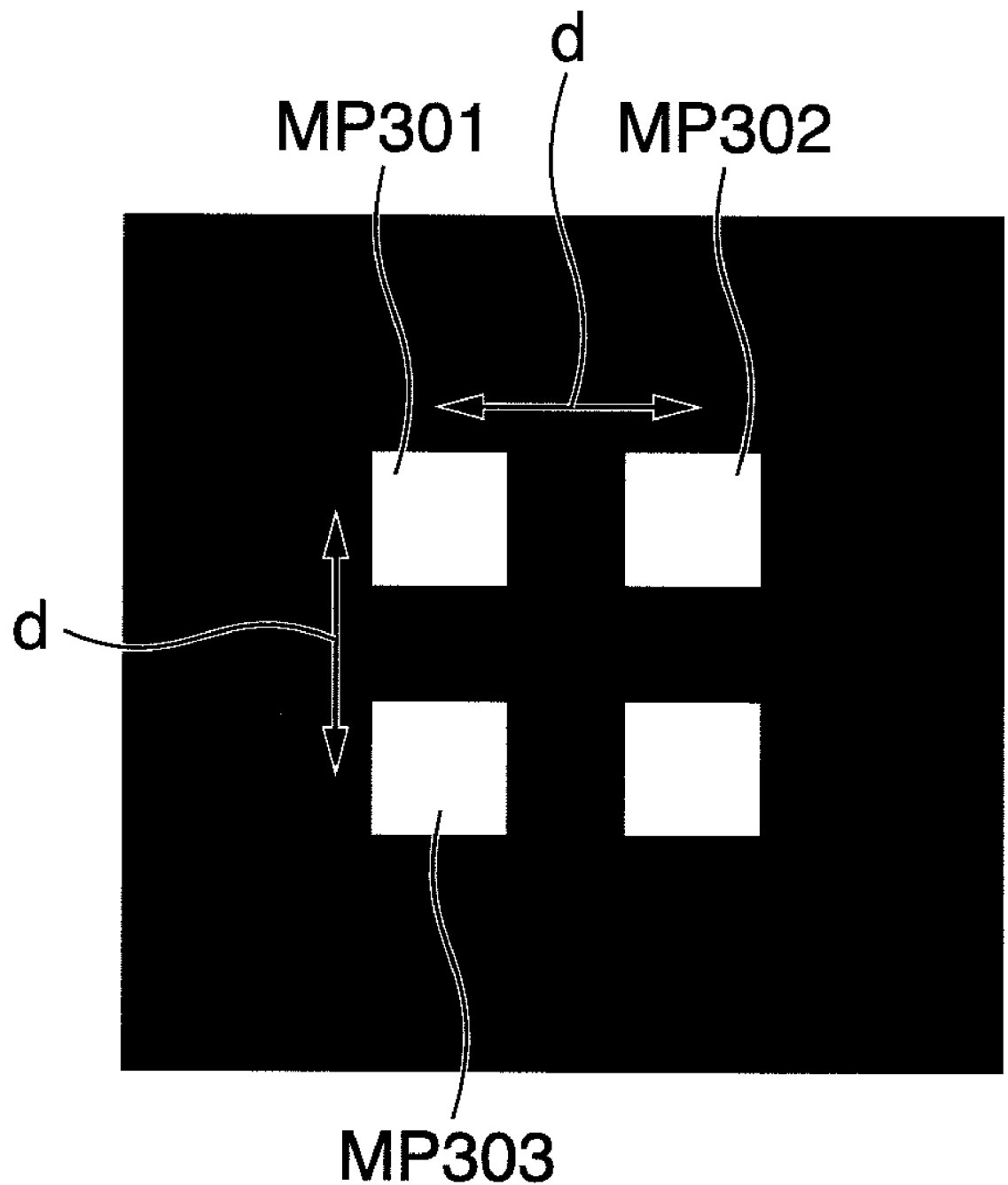
FIG. 22 is a view showing pattern data according to the sixth working example of the present invention.
Figure 23:
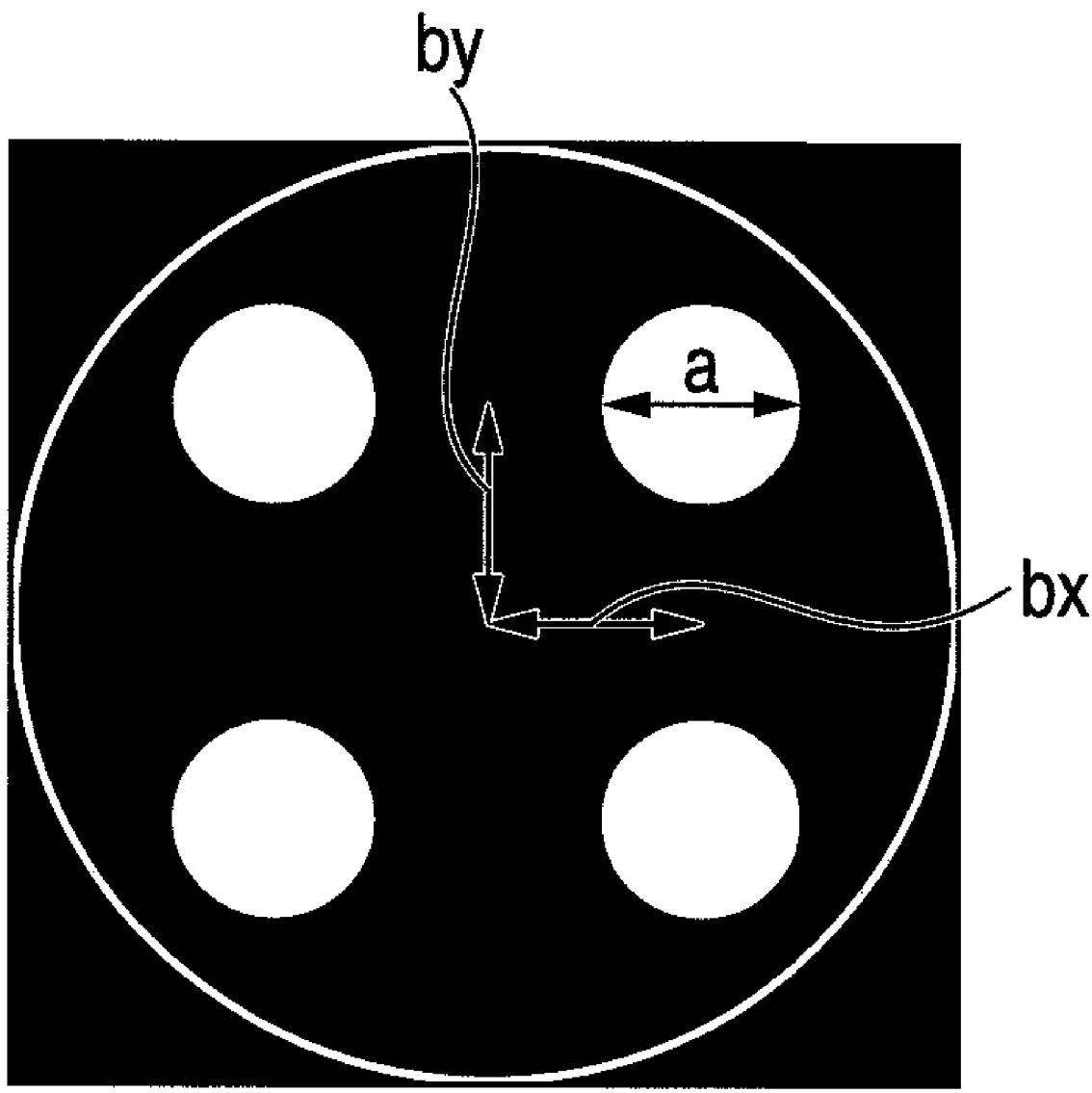
FIG. 23 is a graph showing an effective light source according to the sixth working example of the present invention.

Assume, for example, that the NA of an exposure apparatus 100 (see FIG. 28) is 0.73, and the wavelength λ of exposure light is 248 nm. Consider a case wherein an optimal effective light source is calculated for a layout pattern (pattern data 41) with elements laid out at an interval d=310 nm, as shown in FIG. 22. FIG. 22 is a view showing pattern data according to the sixth working example of the present invention. A circle, which has a radius of one and is drawn by a white line shown in FIG. 23, indicates σ=1. White portions indicate light irradiated portions. The distance from σ=0 to the center of each pole is given such that the distance in the abscissa direction, i.e., x direction, shown in FIG. 23, is bx=0.55, when converting the distance into a σ value, and the distance in the ordinate direction, i.e., y direction shown in FIG. 23, is by=0.55, when converting the distance into a σ value. A diameter a of each pole is 0.2 when converting the diameter into a σ value.

Figure 24:
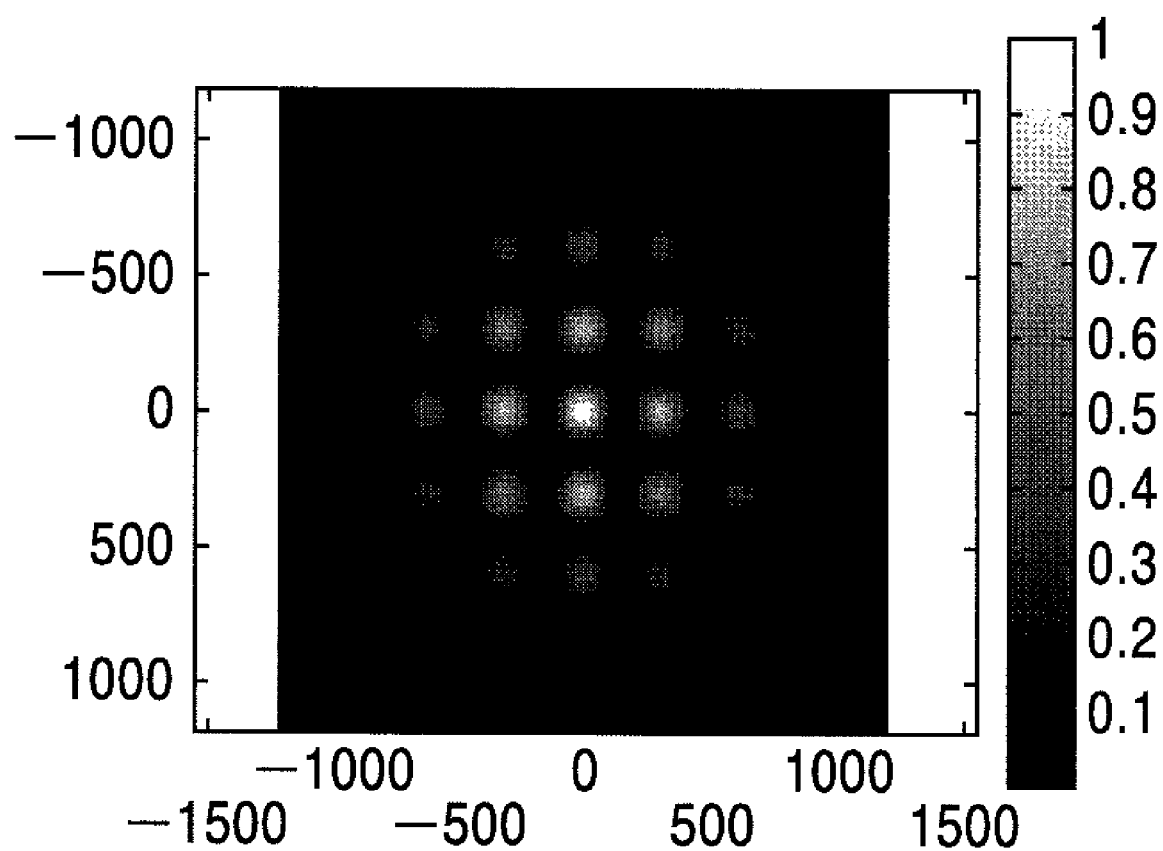
FIG. 24 is a graph showing a coherence map according to the sixth working example of the present invention.

The control unit 20 Fourier-transforms a function indicating an effective light source, as shown in FIG. 23, to generate a coherence map 42 on the mask surface with respect to the origin, as shown in FIG. 24. The scale of FIG. 24 is identical to that shown in FIG. 4. In the coherence map 42 shown in FIG. 24, regions with high coherence appear at a pitch of 310 nm. The coherence map 42 shown in FIG. 24 is obviously suitable for the mask pattern shown in FIG. 22, because contact holes of the mask pattern shown in FIG. 22 are adjacent to each other at an interval d=310 nm.

The control unit 20 shifts the origin of the coherence map 42 to the position of one of elements MP301 to MP303 of interest of the pattern data 41 and matches them. The control unit 20 arranges auxiliary patterns at positions where the coherence in the coherence map 42 is equal to or higher than a set value and corresponds to a peak. As the control unit 20 performs this operation for all the elements MP301 to MP303 of interest, and arranges auxiliary patterns SP301 to SP312, optimal mask data 43 as shown in FIG. 25 can be obtained. The use of the mask data 43 shown in FIG. 25 allows accurate micropattern formation.

Figure 21:
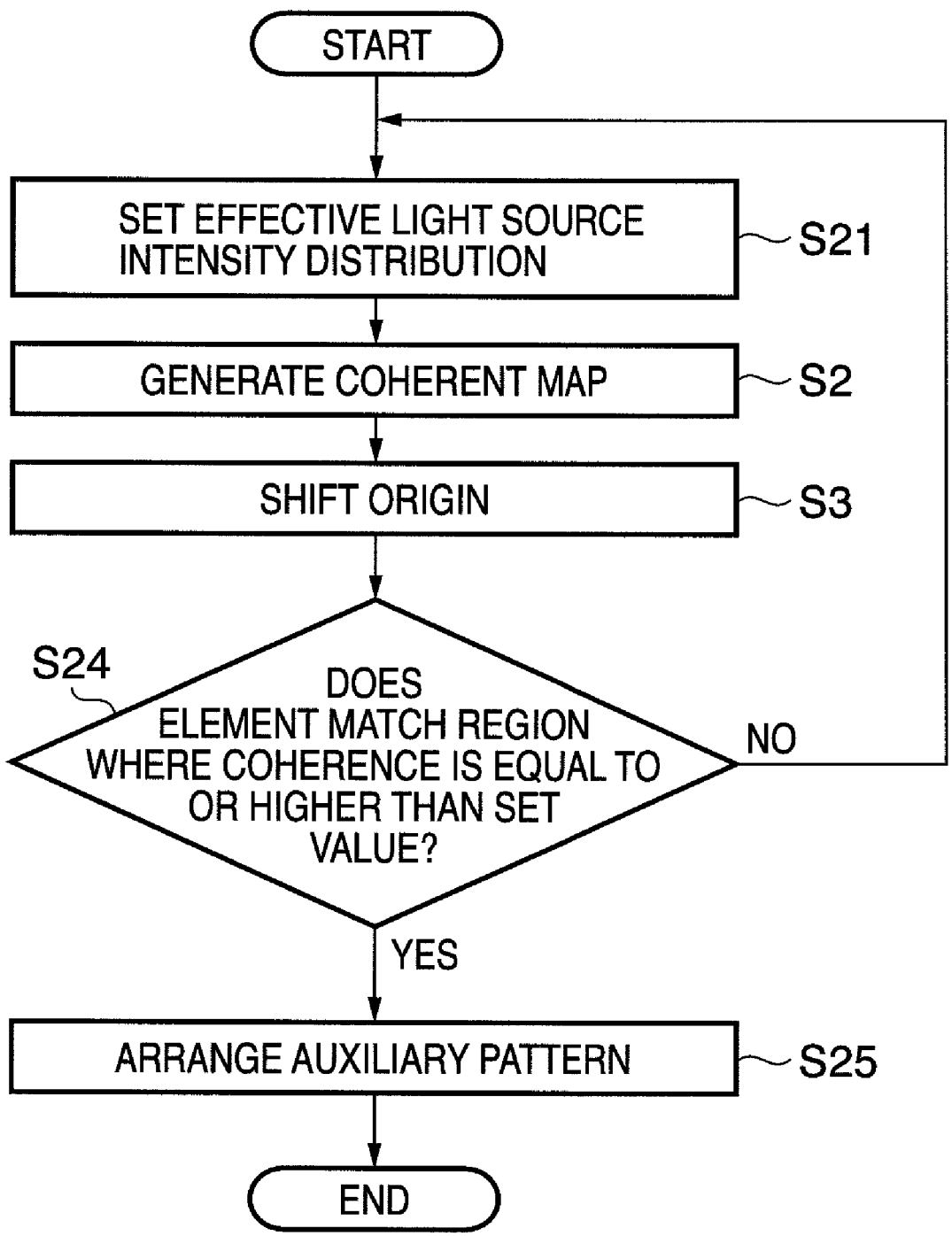
FIG. 21 is a flowchart illustrating a processing sequence for generating mask data by executing a mask data generation program (sixth working example)

A processing sequence for generating mask data by executing a mask data generation program shown in FIG. 21 is different from that shown in FIG. 2 in the following points.

In step S21, the control unit 20 sets an effective light source. The control unit 20 refers to a database (not shown) concerning a function indicating the effective light source and selects and sets this function.

In step S24, the control unit 20 determines whether a region where the coherence is equal to or higher than a set value matches the position of each of the main patterns MP301 to MP303. If YES in step S24, the control unit 20 arranges each of the auxiliary patterns SP301 to SP312 at a position where the coherence is equal to or higher than the set value and matches none of the main patterns MP310 to MP303. The control unit 20 then generates mask data 43. For example, the control unit 20 generates mask data 43 shown in FIG. 25.

If NO in step S24, the process returns to step S21 to set an effective light source again.

To obtain an optimal effective light source, it is necessary to repeat steps S21 to S24 shown in FIG. 21. To end this loop speedily, the initial value of the effective light source is important. In view of this, a method simply and rapidly calculating the initial value of the effective light source will be explained below.

Light diffracted by the mask pattern forms a diffracted light distribution on the pupil plane of a projection optical system. Let O(fx, fy) be the diffracted light distribution. The coordinate position (fx, fy) on the pupil plane is normalized so that the pupil radius is 1. Let circ(fx−a, fy−b) be a function which takes 1 when it falls within a circle having a radius of 1 from the center (a, b), and otherwise, takes 0. Let w(fx, fy) be the weighting function of the diffracted light. The control unit 20 calculates a multiple integral given by:

$$Sraw(fx,fy)=\iint w(fx,fy)O(fx,fy)circ(fx-a,fy-b)dadb \qquad (4)$$

where |a|≦2 and |b|≦2. The control unit further calculates:

$$S(fx,fy)=Sraw(fx,fy)circ(fx,fy). \qquad (5)$$

Then, the control unit 20 sets S(fx, fy) calculated by equation (5) as the set value of the effective light source.

Figure 26:
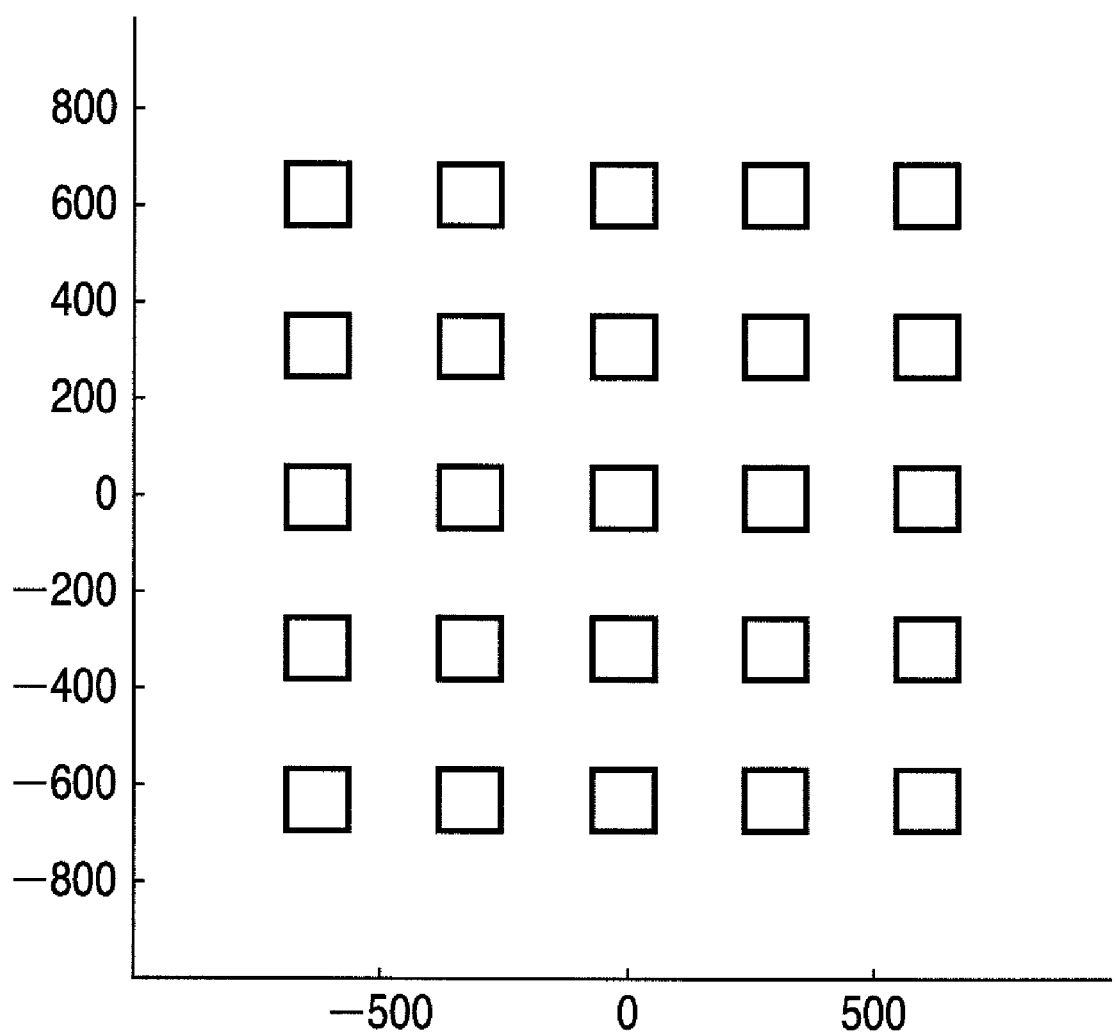
FIG. 26 is a graph showing another pattern data according to the sixth working example of the present invention.
Figure 27:
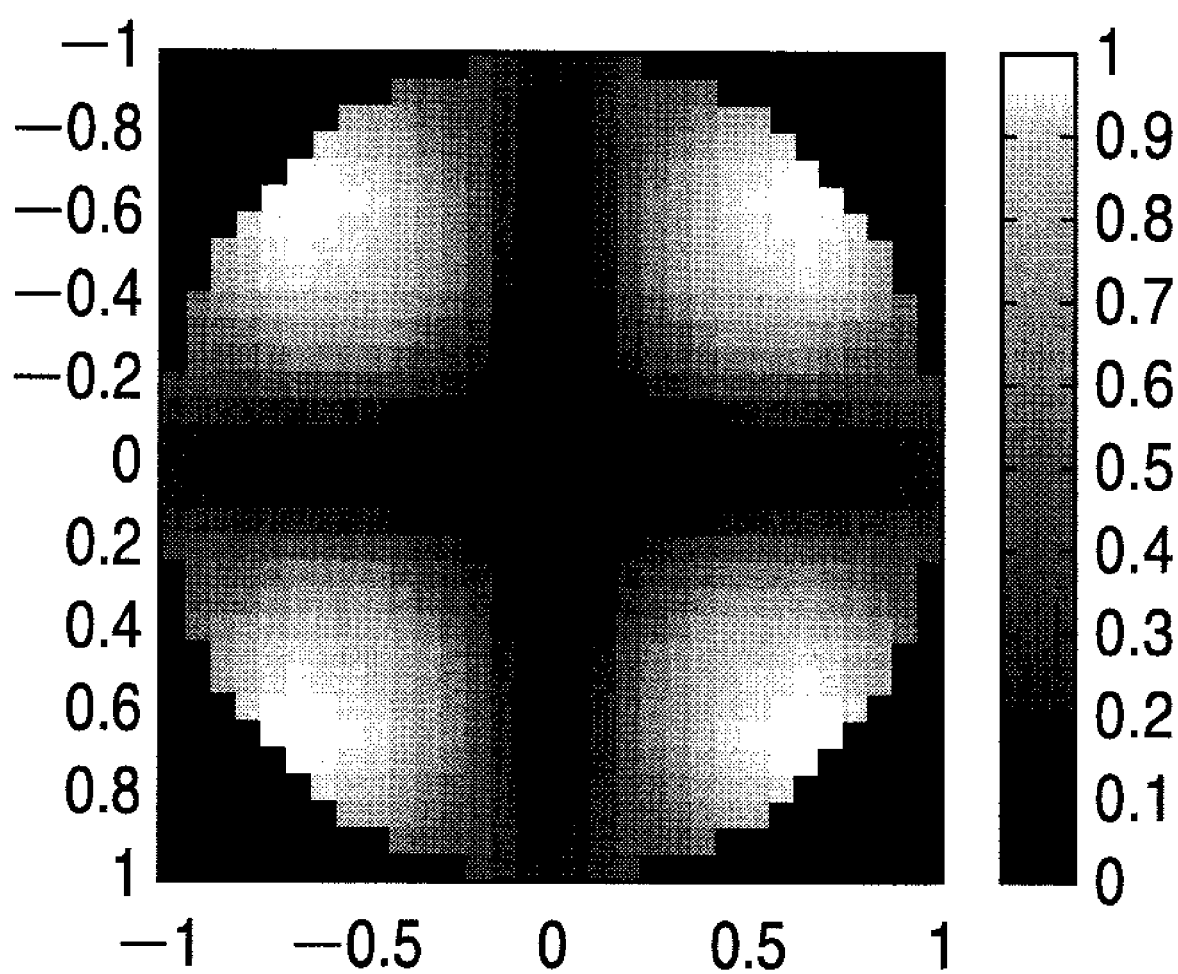
FIG. 27 is a graph showing the initial value of the effective light source according to the sixth working example of the present invention.

Assume, for example, that the pattern data 41 has contact holes, which are two-dimensionally arrayed in five rows and five columns at a pitch of 310 nm, as shown in FIG. 26. FIG. 26 is a graph showing another pattern data according to the sixth working example of the present invention. Referring to FIG. 26, the ordinate indicates the y-coordinate (unit: nm) of the mask surface, and the abscissa indicates the x-coordinate (unit: nm) of the mask surface. The NA of the exposure apparatus 100 (see FIG. 28) is 0.73, and the wavelength of exposure light is 248 nm. In accordance with equations (4) and (5), the control unit 20 calculates the function S(fx, fy) indicating an effective light source. FIG. 27 shows the effective light source indicated by the function S(fx, fy) calculated by the control unit 20. Note that the weighting function w(fx, fy) is roughly a quadratic function. Referring to FIG. 27, the abscissa and ordinate have scales in which coordinates are normalized using the radius of the pupil of the projection optical system as 1, and the color density indicates the magnitude of the light intensity. Also referring to FIG. 27, the light intensity changes continuously. The effective light source shown in FIG. 27 is similar to that shown in FIG. 23. That is, the distribution shown in FIG. 27 is suitable as the initial value (the set value of the effective light source) set in step S21 of the loop from step S21 to step S24 to optimize the effective light source.

In this manner, according to this working example, it is possible to set an effective light source suitable for pattern data. This makes it possible to accurately form a micropattern on a wafer.

Figure 28:
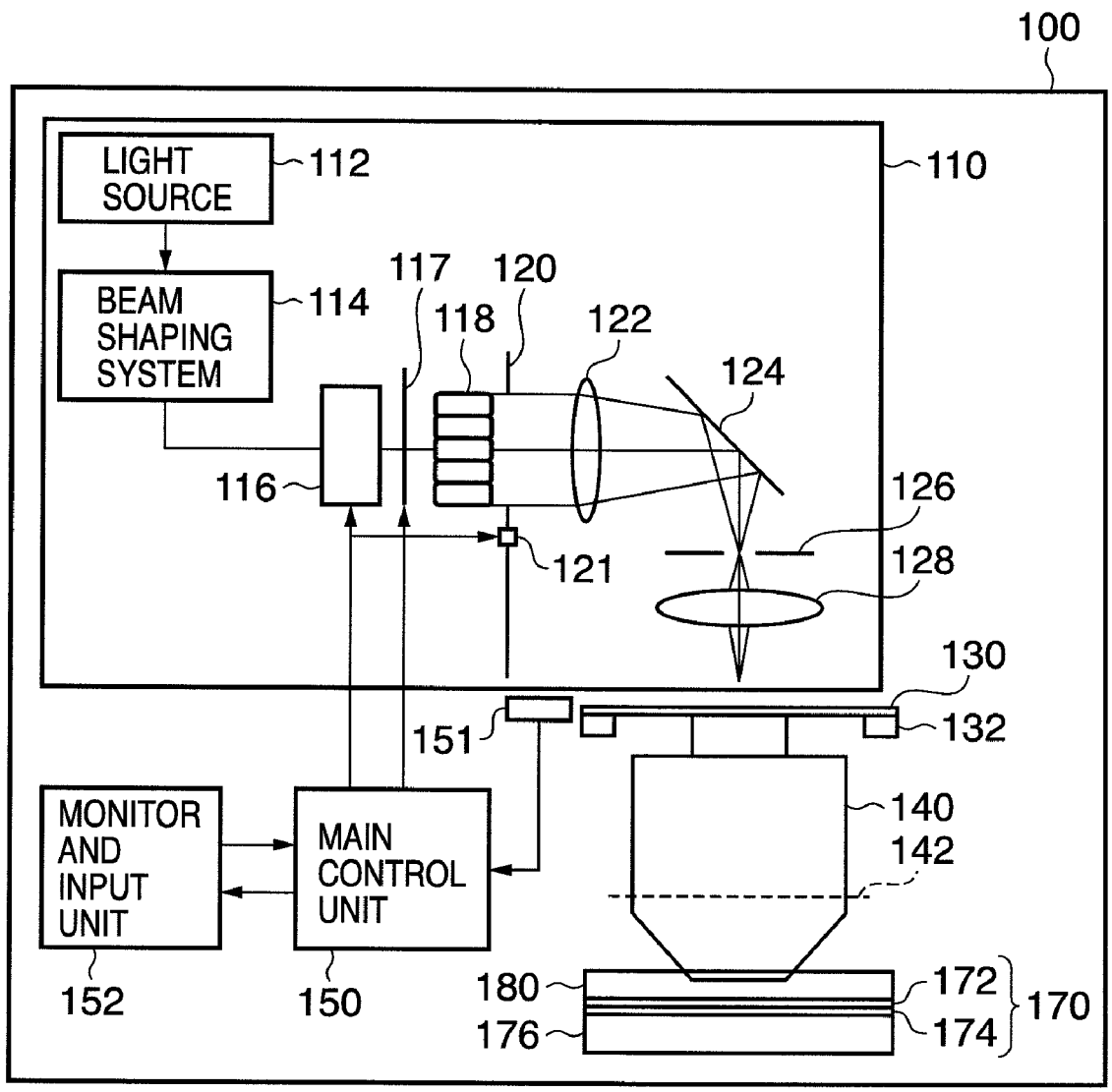
FIG. 28 is a schematic block diagram of an exposure apparatus.

An embodiment of an exposure apparatus 100, which projects a mask pattern image onto a wafer using a mask fabricated in any one of the first to sixth working examples, will be explained next with reference to FIG. 28. FIG. 28 is a schematic block diagram of the exposure apparatus 100.

The exposure apparatus 100 comprises an illumination unit 110, mask stage 132, projection optical system 140, main control unit 150, monitor and input unit 152, and wafer stage 176. A mask 130 is any one of those fabricated in the first to sixth working examples. The exposure apparatus 100 is an immersion exposure apparatus, which transfers the mask pattern onto a wafer 174 by exposure via a liquid 180, while the wafer 174 and the final surface of the projection optical system 140 are in contact with the liquid 180. Although the exposure apparatus 100 is a step-and-scan projection exposure apparatus, it may adopt the step-and-repeat scheme or another exposure scheme.

The illumination unit 110 illuminates the mask 130 on which the circuit pattern to be transferred is formed, and comprises a light source unit and an illumination optical system. The illumination unit 110 forms the effective light source, as described in the above working examples, on the pupil plane of the projection optical system.

The light source unit includes a laser 112 serving as a light source, and a beam shaping system 114. In this embodiment, the laser 112 uses a KrF excimer laser having a wavelength of 248 nm. Alternatively, the laser 112 can adopt an ArF excimer laser having a wavelength of about 193 nm or an $F_2$ excimer laser having a wavelength of about 157 nm.

The beam shaping system 114 shapes the section of collimated light from the laser 112 and guides the shaped light to an optical integrator 118 (to be described later).

The illumination optical system illuminates the mask 130. In this embodiment, the illumination optical system includes a condenser optical system 116, polarization control means 117, optical integrator 118, aperture stop 120, condenser lens 122, bending mirror 124, masking blade 126, and image lens 128. The illumination optical system can attain various illumination modes, such as off axis illumination shown in FIG. 7 or 18, in addition to normal illumination.

The condenser optical system 116 includes a plurality of optical elements, and efficiently guides a light beam with a desired shape to the optical integrator 118. For example, the condenser optical system 116 includes a zoom lens system and controls the allocation of the shape and angle of a beam that enters the optical integrator 118.

The condenser optical system 116 includes an exposure amount adjusting unit, which can change the amount of illumination light to expose the mask 130 for every illumination.

The polarization control means 117 includes, e.g., a polarizing element and is nearly conjugate to a pupil plane 142 of the projection optical system 140. As described with reference to FIG. 7, the polarization control means 117 controls the polarization state of a predetermined region of an effective light source formed on the pupil plane 142. A polarization control means 117, including a plurality of types of polarizing elements, may be arranged on a turret, which can be rotated by an actuator (not shown), and the main control unit 150 may control to drive the actuator.

The optical integrator 118 is a member for making illumination light to be applied to the mask 130 uniform. In this embodiment, the optical integrator 118 uses a fly-eye lens. Alternatively, the optical integrator 118 can use, e.g., an optical rod, a diffraction optical element, or a microlens array.

The aperture stop 120, having a fixed shape and diameter, is inserted immediately after the exit surface of the optical integrator 118. The aperture stop 120 is nearly conjugate to the pupil plane 142 of the projection optical system 140. The aperture shape of the aperture stop 120 corresponds to an effective light source, as shown in FIG. 7 or 18, which is formed on the pupil plane 142 of the projection optical system 140. The aperture stop 120 controls the effective light source. It should be noted that a diffractive optical element (e.g., CGH), or a prism may be arranged in the light source side of the optical integrator 118, and that the effective light source may be shaped by using the diffractive optical element or the prism in lieu of using the aperture stop.

A stop exchange mechanism (actuator) 121 can switch the aperture stop 120 to be inserted in the optical path, in accordance with the illumination condition. A driving control unit 151 controlled by the main control unit 150 controls operation to drive the actuator 121. It should be noted that the aperture stop 120 may be formed integrally with the polarization control means 117.

The condenser lens 122 condenses a plurality of light beams that have emerged from a secondary source near the exit surface of the optical integrator 118 and are transmitted through the aperture stop 120. The condenser lens 122 then guides the light beams to be reflected by the bending mirror 124, and uniformly Koehler-illuminates the surface of the masking blade 126 as the light irradiated surface.

The masking blade 126 is a field stop, which includes a plurality of movable light-shielding plates and has a rectangular aperture shape.

The imaging lens 128 projects the aperture shape of the masking blade 126 onto the surface of the mask 130.

The mask 130 has a transfer pattern and an auxiliary pattern formed, and is supported and driven by the mask stage 132. Light diffracted by the mask 130 is projected onto the wafer 174 via the projection optical system 140. The mask 130 is arranged at a position optically conjugate to the wafer 174. The mask 130 can use any one of a binary mask, a halftone mask, and a phase shift mask.

The projection optical system 140 projects the pattern formed on the mask 130 onto the wafer 174. The projection optical system 140 can use a dioptric system, including only a plurality of lens elements, or a catadioptric system, including a plurality of lens elements, and at least one concave mirror.

The main control unit 150 controls operation to drive each unit, and, especially, controls illumination on the basis of information input from an input section of the monitor and input unit 152, and information (e.g., information sent from the detection unit 151) from the illumination unit 110. For example, the main control unit 150 controls operation to drive the aperture stop 120 via the driving mechanism 121. A monitor of the monitor and input unit 152 displays control information obtained by the main control unit 150 and other information. The main control unit 150 receives information of the effective light source as described in the above working example (for example, the information of the effective light source calculated in sixth working example) via the monitor and input unit 152 from a user, and controls the aperture stop (alternatively, the diffractive optical element or the prism), to form the effective light source.

A photoresist 172 is applied to a wafer 174 of the substrate 170. It should be noted that the substrate 170 may be replaced with a liquid crystal substrate or another exposure target body.

A wafer stage 176 supports the wafer 174.

A material, which has a good transmittance of the exposure light wavelength, prevents dirt from adhering to the projection optical system, and well matches the resist process, is selected as the liquid 180. This embodiment uses pure water.

In exposure, a light beam emitted by the laser 112 is shaped by the beam shaping system 114, and then guided to the optical integrator 118 via the condenser optical system 116. The optical integrator 118 makes the illumination light uniform, and the aperture stop 120 sets the effective light source, as shown in FIG. 7 or 18. The resultant illumination light illuminates the mask 130 under an optimal illumination condition via the condenser lens 122, bending mirror 124, masking blade 126, and imaging lens 128. The projection optical system 140 reduces and projects the light beam having passed through the mask 130 onto the wafer 174 with a predetermined magnification.

Since the substrate 170 and the final surface of the projection optical system 140 are in contact with a liquid 180 having a refractive index higher than that of air, the NA of the projection optical system 140 is relatively high and also, the resolution is so high as to form a fine micropattern on the wafer 170. A high-contrast image is formed on the photoresist 172 under polarization control. Although this embodiment has exemplified the immersion exposure apparatus using the liquid 180, it need not always be used.

Figure 29:
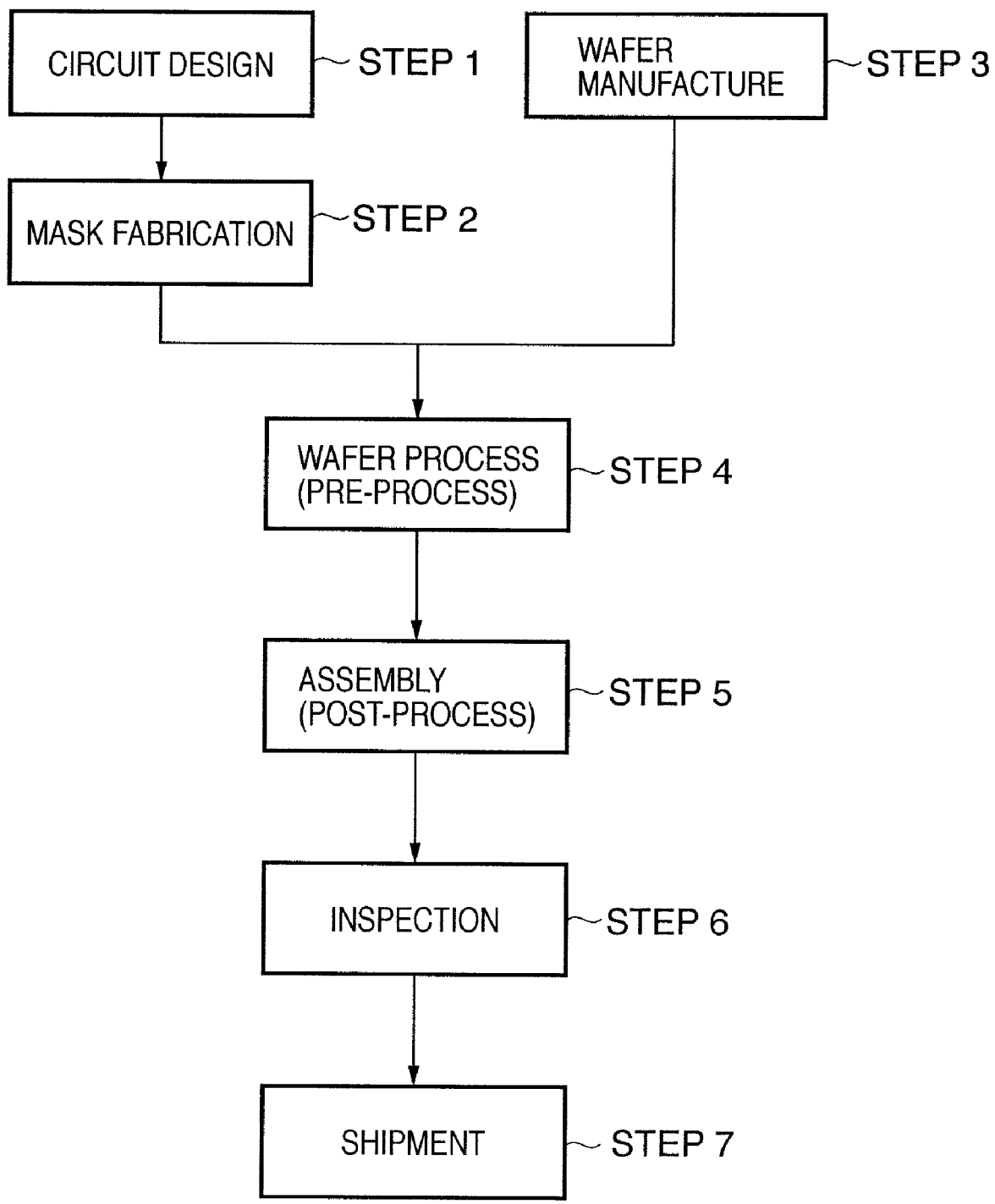
FIG. 29 is a flowchart illustrating a device manufacturing method using an exposure apparatus.

A device manufacturing method, using an exposure apparatus 100 to which a mask 130 fabricated in any one of the first to sixth working examples is applied, will be explained next with reference to FIGS. 29 and 30. FIG. 29 is a flowchart for explaining the manufacture of a device (e.g., a semiconductor chip, such as an IC or LSI, an LCD, or a CCD). The manufacture of a semiconductor chip will be exemplified here.

In step 1 (circuit design), the circuit of a device is designed. More specifically, a design is made at schematic levels on the basis of the functional specification and then a layout design is made. In the layout design, the above-described layout pattern is designed using CAD software to generate pattern data 41.

In step 2 (mask fabrication), a mask, suitable to form the designed circuit pattern, is fabricated. More specifically, mask data 43 is generated by the method according to the present invention. An EB drawing apparatus then receives the mask data 43 and draws a pattern of, e.g., Cr, corresponding to the mask data 43 on the mask 130. With this operation, the mask 130 is fabricated.

In step 3 (wafer manufacture), a wafer is manufactured, using a material such as silicon. In step 4 (wafer process), called a pre-process, an actual circuit is formed on the wafer using the mask and wafer by the lithography technique according to the present invention. In step 5 (assembly), called a post-process, a semiconductor chip is formed using the wafer manufactured in step 4. This step includes an assembly step (dicing and bonding) and a packaging step (chip encapsulation). In step 6 (inspection), the semiconductor device manufactured in step 5 undergoes inspections, such as an operation confirmation test and a durability test. After these steps, the semiconductor device is completed and shipped in step 7 (shipment).

FIG. 30 is a flowchart illustrating details of the wafer process in step 4. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist process), a photoresist is applied to the wafer. In step 16 (exposure), the exposure apparatus 100 transfers the circuit pattern of the mask onto the wafer by exposure. In step 17 (development), the exposed wafer is developed. In step 18 (etching), portions other than the developed resist image are etched. In step 19 (resist removal), any unnecessary resist remaining after etching is removed. These steps are repeated to form multiple circuit patterns on the wafer.

This device manufacturing method can improve the yield in device manufacture.

Although the preferred embodiments and working examples of the present invention have been described above, the present invention is not limited to these embodiments and working examples, and various modifications and changes can be made without departing from the spirit and scope of the present invention. For example, although the above-described element and working examples have introduced exposure methods using a binary mask, the same auxiliary pattern insertion method is also applicable to a halftone mask. The halftone mask here means a mask in which a light-shielding portion of a binary mask is made of a translucent member, and an opening portion exhibits a phase difference of 180°. Note that the use of a halftone mask requires a mask pattern larger than an exposure pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A computer-readable recording medium recording a mask data generation program which causes a computer to generate data of a mask illuminated by illumination light and used to form a latent image on a photoresist via a projection optical system, the program causing the computer to execute:

a map generation step of Fourier-transforming a function indicating an effective light source to generate a coherent map expressing a coherence distribution on an object plane of the projection optical system, on which the mask is arranged;

an arrangement step of arranging a main pattern at an origin of the coherent map and arranging an auxiliary pattern in a region where a coherence with respect to the origin is not less than a set value; and a data generation step of generating mask data including the main pattern and the auxiliary pattern, which are arranged in the arrangement step.

2. The medium according to claim 1, wherein:
in the arrangement step, a certain element is selected in pattern data which serves as a processing target and includes not less than one element, the origin of the coherent map is matched with the selected element, and the auxiliary pattern is additionally arranged in the region where the coherence is not less than the set value.

3. The medium according to claim 1, wherein:
in the map generation step, Fourier transformation is performed by multiplying the function indicating the effective light source by a factor associated with polarization.

4. The medium according to claim 1, wherein a size of the auxiliary pattern is 50% to 85% that of the main pattern.

5. A mask data generation method of generating data of a mask illuminated by illumination light and used to form a latent image on a photoresist via a projection optical system, the method comprising:

a map generation step of Fourier-transforming a function indicating an effective light source to generate a coherent map expressing a coherence distribution on an object plane of the projection optical system, on which the mask is arranged;

an arrangement step of arranging a main pattern at an origin of the coherent map and arranging an auxiliary pattern in a region where a coherence with respect to the origin is not less than a set value; and a data generation step of generating, in a control unit, mask data including the main pattern and the auxiliary pattern, which are arranged in the arrangement step.

6. A mask fabrication method comprising:
a step of fabricating a mask using data of the mask generated by the mask data generation method defined in, claim 5.

7. An exposure method comprising:
an illumination step of illuminating a mask fabricated by the mask fabrication method defined in claim 6; and
a formation step of transferring a pattern image of the mask onto a photoresist via a projection optical system to form a latent image on the photoresist.

8. The method according to claim 7, further comprising:
a determination step of determining whether a region of pattern data, which serves as a processing target and includes a plurality of elements, where a coherence is not less than a set value, matches a position of each of the plurality of elements; and a setting step of setting a function indicating a new effective light source, if the region where the coherence is not less than the set value is determined, in the determination step, not to match the position of each of the plurality of elements.

9. A device manufacturing method comprising:
an exposure step of transferring a pattern image of a mask onto a photoresist to form a latent image on the photoresist by the exposure method defined in claim 7; and
a development step of developing the latent image.

* * * * *